United States Patent
Megretski et al.

(10) Patent No.: US 10,897,276 B2
(45) Date of Patent: Jan. 19, 2021

(54) DIGITAL PREDISTORTION IN VARYING OPERATING CONDITIONS

(71) Applicant: NanoSemi, Inc., Waltham, MA (US)

(72) Inventors: Alexandre Megretski, Concord, MA (US); Kevin Chuang, Cambridge, MA (US); Yan Li, Lexington, MA (US); Zohaib Mahmood, Westwood, MA (US); Helen H. Kim, Sudbury, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 17/005,999

(22) Filed: Aug. 28, 2020

(65) Prior Publication Data

US 2020/0395964 A1    Dec. 17, 2020

Related U.S. Application Data

(63) Continuation of application No. 16/422,448, filed on May 24, 2019, now Pat. No. 10,763,904.

(Continued)

(51) Int. Cl.
   *H04K 1/02*     (2006.01)
   *H04B 1/04*     (2006.01)
   (Continued)

(52) U.S. Cl.
   CPC ......... *H04B 1/0475* (2013.01); *G06F 16/221* (2019.01); *G06F 16/2379* (2019.01); *H04B 2001/045* (2013.01); *H04B 2001/0425* (2013.01)

(58) Field of Classification Search
   CPC .......... H04B 1/0475; H04B 2001/0425; H04B 2001/045; G06F 16/221; G06F 16/2379
   (Continued)

(56) References Cited

U.S. PATENT DOCUMENTS

| | | |
|---|---|---|
| 4,979,126 A | 12/1990 | Pao et al. |
| 5,819,165 A | 10/1998 | Hulkko et al. |

(Continued)

FOREIGN PATENT DOCUMENTS

| | | |
|---|---|---|
| CN | 101379718 A | 3/2009 |
| CN | 101971507 A | 2/2011 |

(Continued)

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.

(Continued)

*Primary Examiner* — Zewdu A Kassa
(74) *Attorney, Agent, or Firm* — Occhiuti & Rohlicek LLP

(57) ABSTRACT

Disclosed are implementations for digital predistortion of signals provided to a radio frequency (RF) transmission path configured to transmit radio signals in a plurality of subbands within a spectral range, including a method that includes configuring a digital predistorter for predistorting signals comprising arbitrary spectral content within the spectral range. The configuring includes acquiring data samples representing operation of the RF transmission path to transmit radio signals in different subbands, each sample including a digital input signal representing spectral content concentrated in a respective subband, and updating parameters of the digital predistorter according to the acquired data samples to mitigate non-linear characteristics of the RF transmission path. The method further includes receiving a further input signal representing spectral content in a particular subband within the spectral range, and using the configured predistorter to process the further input signal to (Continued)

US 10,897,276 B2

Page 2 yield a predistorted signal for providing to the RF transmission path.

20 Claims, 8 Drawing Sheets

Related U.S. Application Data

(60) Provisional application No. 62/676,617, filed on May 25, 2018, provisional application No. 62/676,677, filed on May 25, 2018, provisional application No. 62/676,682, filed on May 25, 2018.

(51) Int. Cl.
    *G06F 16/22*     (2019.01)
    *G06F 16/23*     (2019.01)

(58) Field of Classification Search
    USPC .................. 375/297, 296, 295, 316, 219
    See application file for complete search history.

(56) References Cited

U.S. PATENT DOCUMENTS

| | | | |
|---|---|---|---|
| 5,980,457 A | 11/1999 | Averkiou | |
| 6,052,412 A | 4/2000 | Ruether et al. | |
| 6,240,278 B1 | 5/2001 | Midya et al. | |
| 6,288,610 B1 | 9/2001 | Miyashita | |
| 6,549,067 B1 | 4/2003 | Kenington | |
| 7,289,773 B2 | 10/2007 | Braithwaite | |
| 7,295,815 B1 | 11/2007 | Wright et al. | |
| 7,321,264 B2 | 1/2008 | Kokkeler | |
| 7,333,557 B2 | 2/2008 | Rashev et al. | |
| 7,469,491 B2 | 12/2008 | McCallister et al. | |
| 7,529,652 B1 | 5/2009 | Gahinet et al. | |
| 7,577,211 B2 | 8/2009 | Braithwaite | |
| 7,599,431 B1 | 10/2009 | Anderson et al. | |
| 7,634,238 B2 | 12/2009 | Suzuki et al. | |
| 7,796,960 B1 | 9/2010 | Rashev et al. | |
| 7,904,033 B1 | 3/2011 | Wright et al. | |
| 8,185,066 B2 | 5/2012 | Camp, Jr. et al. | |
| 8,306,149 B2 | 11/2012 | Mujica et al. | |
| 8,391,809 B1 | 3/2013 | Fuller | |
| 8,411,730 B2 | 4/2013 | Maeda | |
| 8,446,979 B1 | 5/2013 | Yee | |
| 8,498,590 B1 | 7/2013 | Rashev et al. | |
| 8,519,789 B2 | 8/2013 | Hawkes | |
| 8,576,941 B2 | 11/2013 | Bai | |
| 8,644,437 B2 | 2/2014 | Kim et al. | |
| 8,666,336 B1 | 3/2014 | Dick | |
| 8,711,976 B2 | 4/2014 | Chandrasekaran | |
| 8,731,005 B2 | 5/2014 | Schlee | |
| 8,731,105 B2 | 5/2014 | Bai | |
| 9,071,207 B2 | 6/2015 | Bai | |
| 9,130,628 B1 | 9/2015 | Mittal et al. | |
| 9,173,173 B2 | 10/2015 | Wei et al. | |
| 9,184,710 B2 | 11/2015 | Braithwaite | |
| 9,226,189 B1 | 12/2015 | Kularatna et al. | |
| 9,252,712 B2 | 2/2016 | Li et al. | |
| 9,331,882 B2 | 5/2016 | Fehri et al. | |
| 9,337,782 B1 | 5/2016 | Mauer et al. | |
| 9,564,876 B2 | 2/2017 | Kim et al. | |
| 9,590,668 B1 | 3/2017 | Kim et al. | |
| 9,595,920 B2 | 3/2017 | Li et al. | |
| 9,614,557 B1 | 4/2017 | Mayer et al. | |
| 9,621,236 B2 | 4/2017 | Ghannouchi et al. | |
| 9,628,119 B2 | 4/2017 | Gal et al. | |
| 9,722,646 B1 | 8/2017 | Matthews et al. | |
| 9,749,161 B1 | 8/2017 | Gal et al. | |
| 9,935,810 B1 | 4/2018 | Hammler et al. | |
| 9,973,370 B1 | 5/2018 | Langer et al. | |
| 10,033,413 B2 | 7/2018 | Pratt | |
| 10,033,414 B2 | 7/2018 | Ota | |
| 10,079,699 B1 | 9/2018 | Li et al. | |
| 10,080,178 B2 | 9/2018 | Stapleton et al. | |
| 10,141,896 B2 | 11/2018 | Huang | |
| 10,141,961 B1 | 11/2018 | Huang et al. | |
| 10,181,914 B2 | 1/2019 | Li et al. | |
| 10,404,296 B2 | 9/2019 | Kim et al. | |
| 10,447,511 B2 | 10/2019 | Xie et al. | |
| 10,469,109 B2 | 11/2019 | Gutman et al. | |
| 10,523,159 B2 | 12/2019 | Megretski et al. | |
| 10,581,470 B2 | 3/2020 | Megretski et al. | |
| 10,644,657 B1 | 5/2020 | Megretski et al. | |
| 2001/0050592 A1 | 12/2001 | Wright et al. | |
| 2002/0080891 A1 | 6/2002 | Ahn et al. | |
| 2003/0058960 A1* | 3/2003 | Lee .................. H03F 1/3294 375/297 |
| 2003/0184374 A1 | 10/2003 | Huang | |
| 2003/0207680 A1 | 11/2003 | Yang et al. | |
| 2004/0076247 A1 | 4/2004 | Barak et al. | |
| 2004/0116083 A1 | 6/2004 | Suzuki et al. | |
| 2004/0142667 A1 | 7/2004 | Lochhead et al. | |
| 2004/0196922 A1 | 10/2004 | Leffel | |
| 2005/0001684 A1 | 1/2005 | Braithwaite | |
| 2005/0163251 A1 | 7/2005 | McCallister | |
| 2005/0163252 A1 | 7/2005 | McCallister et al. | |
| 2005/0180527 A1 | 8/2005 | Suzuki et al. | |
| 2005/0190857 A1 | 9/2005 | Braithwaite | |
| 2006/0022751 A1 | 2/2006 | Fuller et al. | |
| 2006/0154622 A1 | 7/2006 | Piirainen | |
| 2006/0229036 A1 | 10/2006 | Muller et al. | |
| 2006/0276147 A1 | 12/2006 | Suzuki | |
| 2007/0091992 A1 | 4/2007 | Dowling | |
| 2007/0230557 A1 | 10/2007 | Balasubramonian et al. | |
| 2007/0241812 A1 | 10/2007 | Yang et al. | |
| 2008/0003945 A1 | 1/2008 | Wenham | |
| 2008/0019453 A1 | 1/2008 | Zhao et al. | |
| 2008/0039045 A1 | 2/2008 | Filipovic et al. | |
| 2008/0057882 A1 | 3/2008 | Singerl | |
| 2008/0101502 A1 | 5/2008 | Navidpour et al. | |
| 2008/0247487 A1 | 10/2008 | Cai et al. | |
| 2008/0260066 A1 | 10/2008 | Cai et al. | |
| 2008/0268795 A1 | 10/2008 | Saed | |
| 2008/0285640 A1 | 11/2008 | McCallister | |
| 2009/0201084 A1 | 8/2009 | See et al. | |
| 2010/0026354 A1 | 2/2010 | Utsunomiya et al. | |
| 2010/0048149 A1 | 2/2010 | Tang et al. | |
| 2010/0225390 A1 | 9/2010 | Brown | |
| 2010/0297966 A1 | 11/2010 | Row et al. | |
| 2011/0044158 A1 | 2/2011 | Tao et al. | |
| 2011/0085490 A1 | 4/2011 | Schlee | |
| 2011/0098011 A1 | 4/2011 | Camp, Jr. et al. | |
| 2011/0128992 A1 | 6/2011 | Maeda et al. | |
| 2011/0135035 A1 | 6/2011 | Bose et al. | |
| 2011/0150130 A1 | 6/2011 | Kenington | |
| 2011/0163806 A1 | 7/2011 | Hongo | |
| 2011/0187437 A1 | 8/2011 | Perreault et al. | |
| 2011/0235734 A1 | 9/2011 | Kenington | |
| 2011/0255627 A1 | 10/2011 | Gotman et al. | |
| 2011/0273234 A1 | 11/2011 | Van der Heijen et al. | |
| 2011/0273236 A1 | 11/2011 | Heijden et al. | |
| 2012/0093210 A1 | 4/2012 | Schmidt et al. | |
| 2012/0108189 A1 | 5/2012 | McCallister et al. | |
| 2012/0119810 A1 | 5/2012 | Bai | |
| 2012/0119811 A1 | 5/2012 | Bai et al. | |
| 2012/0119831 A1 | 5/2012 | Bai | |
| 2012/0154033 A1 | 6/2012 | Lozhkin | |
| 2012/0154430 A1 | 6/2012 | Matsushima et al. | |
| 2012/0176195 A1 | 7/2012 | Dawson et al. | |
| 2012/0200355 A1 | 8/2012 | Braithwaite | |
| 2012/0219048 A1 | 8/2012 | Camuffo et al. | |
| 2012/0286865 A1 | 11/2012 | Chandrasekaran | |
| 2012/0286985 A1 | 11/2012 | Chandrasekaran et al. | |
| 2012/0293252 A1 | 11/2012 | Sorrells et al. | |
| 2012/0295558 A1 | 11/2012 | Wang et al. | |
| 2013/0033317 A1 | 2/2013 | Hawkes | |
| 2013/0034188 A1 | 2/2013 | Rashev et al. | |
| 2013/0044791 A1 | 2/2013 | Rimini et al. | |
| 2013/0064325 A1 | 3/2013 | Kilambi et al. | |
| 2013/0094610 A1 | 4/2013 | Ghannouchi et al. | |
| 2013/0094612 A1 | 4/2013 | Kim et al. | |
| 2013/0163512 A1 | 6/2013 | Rexberg et al. | |

(56) References Cited

U.S. PATENT DOCUMENTS

| | | |
|---|---|---|
| 2013/0243121 A1 | 9/2013 | Bai |
| 2013/0251065 A1 | 9/2013 | Bai |
| 2013/0259159 A1 | 10/2013 | McCallister et al. |
| 2013/0329833 A1 | 12/2013 | Bai |
| 2014/0009225 A1 | 1/2014 | Laporte |
| 2014/0038659 A1 | 2/2014 | Wei et al. |
| 2014/0161159 A1 | 6/2014 | Black et al. |
| 2014/0161207 A1 | 6/2014 | Teterwak |
| 2014/0177695 A1 | 6/2014 | Cha et al. |
| 2014/0187182 A1 | 7/2014 | Yan et al. |
| 2014/0254716 A1 | 9/2014 | Zhou et al. |
| 2014/0274105 A1 | 9/2014 | Wang |
| 2014/0292579 A1 | 10/2014 | Oh et al. |
| 2014/0347126 A1 | 11/2014 | Laporte et al. |
| 2015/0043313 A1 | 2/2015 | Stranczl et al. |
| 2015/0043323 A1 | 2/2015 | Choi et al. |
| 2015/0043678 A1 | 2/2015 | Hammi |
| 2015/0049841 A1 | 2/2015 | Laporte et al. |
| 2015/0061761 A1 | 3/2015 | Wills et al. |
| 2015/0103952 A1 | 4/2015 | Wang et al. |
| 2015/0123735 A1 | 5/2015 | Wimpenny |
| 2015/0124907 A1 | 5/2015 | Li et al. |
| 2015/0171768 A1 | 6/2015 | Perreault |
| 2015/0325913 A1 | 11/2015 | Vagman |
| 2015/0326349 A1 | 11/2015 | Yang et al. |
| 2015/0333781 A1 | 11/2015 | Alon et al. |
| 2015/0357975 A1 | 12/2015 | Avniel et al. |
| 2015/0358039 A1 | 12/2015 | Xiong et al. |
| 2015/0381216 A1 | 12/2015 | Shor et al. |
| 2015/0381220 A1 | 12/2015 | Gal et al. |
| 2016/0028433 A1 | 1/2016 | Ding et al. |
| 2016/0065147 A1 | 3/2016 | Pratt et al. |
| 2016/0087604 A1 | 3/2016 | Kim et al. |
| 2016/0094253 A1 | 3/2016 | Weber et al. |
| 2016/0095110 A1 | 3/2016 | Li et al. |
| 2016/0100180 A1 | 4/2016 | Oh |
| 2016/0112222 A1 | 4/2016 | Pashay-Kojouri et al. |
| 2016/0174118 A1* | 6/2016 | Duan ................ H04W 36/24 370/329 |
| 2016/0191020 A1 | 6/2016 | Velazquez |
| 2016/0211577 A1 | 7/2016 | Miller et al. |
| 2016/0241277 A1 | 8/2016 | Rexberg et al. |
| 2016/0249300 A1 | 8/2016 | Tsai et al. |
| 2016/0285485 A1 | 9/2016 | Fehri et al. |
| 2016/0308577 A1 | 10/2016 | Molina et al. |
| 2016/0336906 A1 | 11/2016 | Lee et al. |
| 2016/0373072 A1 | 12/2016 | Magesacher et al. |
| 2017/0005627 A1 | 1/2017 | Zhao et al. |
| 2017/0033969 A1 | 2/2017 | Yang et al. |
| 2017/0041124 A1 | 2/2017 | Khandani |
| 2017/0047899 A1 | 2/2017 | Abdelrahman et al. |
| 2017/0077981 A1 | 3/2017 | Tobisu et al. |
| 2017/0176507 A1 | 6/2017 | O'Keeffe et al. |
| 2017/0214438 A1 | 7/2017 | Ghannouchi et al. |
| 2017/0237455 A1 | 8/2017 | Ye et al. |
| 2017/0244582 A1 | 8/2017 | Gal et al. |
| 2017/0302233 A1 | 10/2017 | Huang |
| 2017/0338841 A1 | 11/2017 | Pratt |
| 2018/0097530 A1 | 4/2018 | Yang et al. |
| 2018/0159568 A1 | 6/2018 | Matsuura et al. |
| 2018/0167092 A1 | 6/2018 | Hausmair et al. |
| 2018/0287569 A1 | 10/2018 | Xu et al. |
| 2018/0337700 A1 | 11/2018 | Huang et al. |
| 2019/0007075 A1 | 1/2019 | Kim et al. |
| 2019/0104000 A1 | 4/2019 | Xie et al. |
| 2019/0238204 A1 | 8/2019 | Kim et al. |
| 2019/0260401 A1 | 8/2019 | Megretski et al. |
| 2019/0260402 A1 | 8/2019 | Chuang et al. |
| 2019/0348956 A1 | 11/2019 | Megretski et al. |
| 2019/0363676 A1 | 11/2019 | Megretski et al. |
| 2019/0363742 A1 | 11/2019 | Megretski et al. |
| 2020/0028476 A1 | 1/2020 | Kim et al. |
| 2020/0067543 A1 | 2/2020 | Kim et al. |

FOREIGN PATENT DOCUMENTS

| | | |
|---|---|---|
| CN | 104796170 A | 7/2015 |
| CN | 104871433 A | 8/2015 |
| CN | 105634539 A | 6/2016 |
| CN | 106464280 A | 2/2017 |
| EP | 0916967 A2 | 5/1999 |
| EP | 1560329 A1 | 8/2005 |
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 2013-542696 A | 11/2013 |
| JP | 2014-533017 A | 12/2014 |
| WO | 20120154430 A1 | 11/2012 |
| WO | 2015107392 A1 | 7/2015 |
| WO | 2018156932 A1 | 8/2018 |
| WO | 2018227093 A1 | 12/2018 |
| WO | 2018227111 A1 | 12/2018 |
| WO | 2019/014422 A1 | 1/2019 |
| WO | 2019031714 A1 | 2/2019 |
| WO | 2019070573 A1 | 4/2019 |
| WO | 2019094713 A1 | 5/2019 |
| WO | 2019094720 A1 | 5/2019 |

OTHER PUBLICATIONS

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37.No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels," IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

Henrie, et al., "Cancellation of Passive Intermodulation Distortion in Microwave Networks", Proceedings of the 38.sup. th European Microwave Conference, Oct. 2008, Amsterdam, The Netherlands, pp. 1153-1156.

Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.

Kwan, et al., "Concurrent Multi-Band Envelope Modulated Power Amplifier Linearized Using Extended Phase-Aligned ODP", IEEE Transactions on Microwave Theory and Techniques; vol. 62, No. 12, Dec. 2014, pp. 3298-3308.

Lajoinie et al. Efficient Simulation of NPR for the Optimum Design of Satellite Transponders SSPAs, EEE MTT-S International; vol. 2; Jun. 1998; pp. 741-744.

Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.

Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.

Liu, et al."Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.

(56) References Cited

OTHER PUBLICATIONS

Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.

Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.

Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.

Naraharisetti, et a., "2D Cubic Spline Implementation for Concurrent Dual-Band System", IEEE, 2013, pp. 1-4.

Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.

Panigada, et al. "A 130 mW 100 MS/s Pipelined ADC with 69 SNDR Enabled by Digital Harmonic Distortion Correction," IEEE Journal of Solid-State Circuits; vol. 44; No. 12; Dec. 2009, pp. 3314-3328.

Peng, et al. "Digital Predistortion for Power Amplifier Based on Sparse Bayesian Learning", IEEE Transactions on Circuits and Systems, II: Express Briefs; 2015, pp. 1-5.

Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.

Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.

Safari, et al. "Spline-Based Model for Digital Predistortion of Wide-Band Signals for High Power Amplifier Linearization", IEEE; 2007, pp. 1441-1444.

Sevic, et al. "A Novel Envelope-Termination Load-Pull Method of ACPR Optimization of RF/Microwave Power Amplifiers," IEEE MTT-S International; vol. 2, Jun. 1998; pp. 723-726.

Tai, "Efficient Watt-Level Power Amplifiers in Deeply Scaled CMOS," Ph.D. Dissertation; Carnegie Mellon University; May 2011; 129 pages.

Tehran, et al. "Modeling of Long Term Memory Effects in RF Power Amplifiers with Dynamic Parameters", IEEE; 2012, pp. 1-3.

Yu et al. "A Generalized Model Based on Canonical Piecewise Linear Functions for Digital Predistortion", Proceedings of the Asia-Pacific Microwave Conference; 2016, pp. 1-4.

Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.

Yu, et al."Digital Predistortion Using Adaptive Basis Functions", IEEE Transations on Circuits and Systems-I. Regular Papers; vol. 60, No. 12; Dec. 2013, pp. 3317-3327.

Zhang et al. "Linearity Performance of Outphasing Power Amplifier Systems," Design of Linear Outphasing Power Amplifiers; Google e-book; 2003; Retrieved on Jun. 13, 2014; Retrieved from Internet <URL:http:www.artechhouse.com/uploads/public/documents/chapters/Zhang-LarsonCH- 2.pdf; pp. 35-85.

Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.

Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.

Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.

Riihonen et al., "Mitigation of Loopback Self-Interference in Full-Duplex Mimo Relays" IEEE Transactions on Signal Processing, 59(12), 5983-5993, Dec. 2011.

Cheng, Sheng-Lung, Wen-Rong Wu, Chun-Hsien Peng, Chen-Jui Hsu, and Paul Liang. "Digital predistortion for concurrent dual-band transmitter using a 2D LUT based method." In 2015 IEEE 16th Annual Wireless and Microwave Technology Conference (WAMICON), pp. 1-4. IEEE, 2015.

* cited by examiner

DIGITAL PREDISTORTION IN VARYING OPERATING CONDITIONS

CROSS-REFERENCE TO RELATED APPLICATIONS

This application is a continuation of U.S. application Ser. No. 16/422,448, entitled "DIGITAL PREDISTORTION IN VARYING OPERATING CONDITIONS" and filed May 24, 2019, which claims the benefit of U.S. Provisional Application Nos. U.S. 62/676,617, entitled "Parameterized Universal DPD Compensators," U.S. 62/676,677, entitled "Digital Predistortion System with Adaptability to Fast Abrupt Changes of Environmental Characteristics," and U.S. 62/676,682, entitled "Digital Predistortion System Implementation Using Data Samples Selected According to Variety Metrics," all filed May 25, 2018, the contents of all of which are incorporated herein by reference in their entireties.

BACKGROUND

The present disclosure relates to approaches to digital predistortion, and more particularly to one or more techniques that alone or in combination are applicable to digital predistortion in quickly varying operating conditions.

Power amplifiers, especially those used to transmit radio frequency communications, generally have nonlinear characteristics. For example, as a power amplifier's output power approaches its maximum rated output, nonlinear distortion of the output occurs. One way of compensating for the nonlinear characteristics of power amplifiers is to 'predistore' an input signal (e.g., by adding an 'inverse distortion' to the input signal) to negate the nonlinearity of the power amplifier before providing the input signal to the power amplifier. The resulting output of the power amplifier is a linear amplification of the input signal with reduced nonlinear distortion. Digital predistorted devices (comprising, for example, power amplifiers) are relatively inexpensive and power efficient. These properties make digital predistorted power amplifiers attractive for use in telecommunication systems where amplifiers are required to inexpensively, efficiently, and accurately reproduce the signal present at their input. However, the computation effort associated with conventional digital predistortion (DPD) adaptation processes is substantial, which adversely effects the predistortion accuracy and robustness due to the limits the computational efforts may place on the number and speed at which DPD coefficients can be derived.

There are several challenges for DPD adaptation implementations involving bi-directional wireless communication (e.g., between a base station (BS) and a user equipment (UE). For example, a UE typically transmits (uploads data) as needed and with only sufficient output power to save battery power. The adjustment of output power level is achieved by changing, for example, the baseband input level, RF gain, and power supply voltage of a power amplifier. Furthermore, the UE transmitter may be controlled (e.g., at the command of the BS) to make use of varying frequency ranges (e.g., channels) for transmission. Yet further, the mode of operation and parameters, such as power level, power supply voltage level, output load of PA (e.g., VSWR) can rapidly change in UE devices. The combination of such variations in operating conditions can change the characteristics of the transmit chain, and more particularly change the non-linear nature of the transmit chain that is being compensated for by the DPD.

Therefore, there is a need for a DPD approach(es) that can provide high performance DPD (e.g., measured by linearity, error rate, spectral mask violation, etc.) over a substantial range of operating conditions, as well being able to adapt to rapid changes of such operating conditions.

SUMMARY

Disclosed are adaptive digital predistortion implementations that allow the wireless device (generally a UE, but also a base station) to perform quick adaptation ($\mu s$ scale) of its digital predistortion functionality in response to changes to its operating conditions/points (including changes to environmental conditions). Changes to a wireless device's operating conditions can result due to, for example, 1) the sub-carrier within a component carrier changes frequently (e.g., every time slot, with such time slots having durations in tens of $\mu s$) and its spectral content can hop in spectrum rapidly, 2) the UE transmitter needs to adjust average output power by either increasing or reducing the DC supply voltage, 3) changes to other environmental parameters such as temperature and VSWR (such changes may also happen frequently), and/or 4) changes due to the fact that 5G millimeter wave spectrum band is much wider than any existing sub-6 GHz bands, and its spectrum ownership is split between many operators (who operate different bands within that spectral range and may possibly use different technologies). With respect to the latter factor, it is noted that for new millimeter wave spectrum bands, the frequency coverage of a UE device can easily exceed 1 GHz, and as a UE moves from one cell to another, or even as it assigned different cellular resources within a particular cell (by a particular operator), the UE operating points can frequently and abruptly change, thus requiring its digital predistortion functionality to change in accordance with the changes to the operating points.

To address the various problems discussed above, several solutions and approaches to facilitate fast, reliable and robust digital predistortion adaptation techniques are proposed. In one example approach, digital predistortion implementations are provided that are configured for adaptability to fast/abrupt changes in spectral localization, average power, VDD, temperature, VSWR, etc. This adaptability to fast/abrupt changes to the operating points of a wireless device can be achieved, for example, through a DPD system implementation configured to derive an adapted, expanded, set of basis functions, from a first set of DPD basis functions based on operating conditions associated with the wireless device and/or the predistorter system.

In another example approach, a wireless communication device with a universal digital predistortion system is implemented, that is configured to collect training samples from multiple narrow RF bands within a wideband RF spectral range, and optimizes a universal digital predistorter operable over the wideband RF spectral range.

In another example approach to facilitate quick and robust adaptations of digital predistortion functionality, a digital predistortion (DPD) system implements digital predistortion adaptation using data samples selected according to variety metrics. The system may be configured to collect data (e.g., for storage in a variety matrix) distributed over a channel, select a subset of the data that is more uniformly distributed than at least some other subsets of the data, and compute, based on the selected subset of data, digital predistortion parameters to weigh basis functions used to control digital predistortion operations.

Accordingly, in some variations, a method for digital predistortion is provided that includes collecting data for a wireless device comprising a transmit chain that includes at least one power amplifier that produces output with non-linear distortions. The data comprises data records with each data record including input signal data and corresponding output signal data for the transmit chain and is further associated with a set of operating conditions values. Each data record is also associated with a variety measure representative of an extent of distinguishability of the respective data record from other collected data records. The method further includes selecting at least some of the data records according to a variety criterion computed based on the variety measure for the each data record, computing, based on the selected at least some of the data records, digital predistortion parameters used to control a digital predistorter of the wireless device, and applying the digital predistorter, configured with the computed digital predistortion parameters, to subsequent input signals.

Embodiments of the method may include at least some of the features described in the present disclosure, including one or more of the following features.

The set of operating conditions for the each data record may include one or more of, for example, channel information associated with a corresponding channel used by the wireless device to process the respective data record, a corresponding temperature, a corresponding average power, a corresponding power supply voltage ($V_{DD}$) associated with the at least one power amplifier of the transmit chain, a corresponding Voltage Standing Wave Ratio (VSWR) associated with the wireless device, and/or age of the each data record.

Collecting the data for the wireless device may include collecting the data in one or more spectral channels, with the one or more spectral channels located within a wide band spectral range, and with each of the one or more spectral channels having a respective bandwidth smaller than a range bandwidth of the spectral range.

Each of the data records may include one or more samples obtained by the wireless device under a particular set of operating conditions.

The each of the data records may be maintained in a separate column of a records matrix data structure.

Selecting the at least some of the data records according to the variety criterion computed based on the variety measure for the each data record may include selecting data records associated with respective variety measures indicative of high distinguishability in order to increase diversity of the data records used to compute the digital predistortion parameters.

The method may further include computing, for the each data record, the variety measure based on a distance metric representative of distances between data elements of a particular data record, to respective data elements for at least some of the collected data records.

The method may further include maintaining the computed variety measure for the each data record in a distance vector data structure separate from a data structure to store the collected data records.

The method may further include collecting additional data records, storing a particular one of the collected additional data records in a records data structure in response to a determination that a variety measure computed for the particular one of the collected additional data records is more distinguishable, relative to previously stored data records available at the records data structure, than one of the previously stored data records, and re-computing, at regular or irregular intervals, the digital predistortion parameters based on the stored data samples available in the records data structure, including the stored particular one of the collected additional data records.

Storing the particular one of the collected additional data records may include replacing in the records data structures the one of the previously stored data records with the particular one of the collected additional data records.

The method may further include computing a corresponding variety measure for the particular one of the collected additional data records, including determining for each pair of records comprising the particular one of the collected additional data records and at least one of the previously stored data records a maximal absolute value of difference between the corresponding elements of the data records.

Applying the digital predistorter, configured with the digital predistortion parameters, may include weighing basis functions of the digital predistorter, with the basis functions comprising complex terms applied to values of input samples provided in the data records, and with at least some of the basis functions further comprising real terms applied to values of sets of operating conditions associated with the data records.

The method may further include deriving from a first set of basis functions the basis functions of the digital predistorter, the basis functions of the digital predistorter being an expanded set of basis functions that includes (d+1) groups of basis functions, with d being representative of a number of parameters of the operating conditions, wherein a first group of the expanded set of basis functions includes the first set of basis functions without any modification, and with each of the remaining d groups of the expanded set of basis functions being determined as the product of the first set of basis functions and one of the parameters of the operating conditions.

In some variations a linearization system to perform digital predistortion is provided that includes a transmit chain that includes at least one power amplifier that produces output with non-linear distortions, and a digital predistorter comprising an adaptation section and a compensator. The digital predistorter is configured to collect data comprising data records, with each data record including input signal data and corresponding output signal data for the transmit chain and further being associated with a set of operating conditions values, with the each data record being associated with a variety measure being representative of an extent of distinguishability of the respective data record from other collected data records. The digital predistorter is further configured to select at least some of the data records according to a variety criterion computed based on the variety measure for the each data record, compute, based on the selected at least some of the data records, digital predistortion parameters used to control the digital predistorter, and digitally predistort, according to the computed digital predistortion parameters, subsequent input signals.

Embodiments of the linearization system may include at least some of the features described in the present disclosure, including any of the above method features, as well as one or more of the following features.

The digital predistorter configured to select the at least some of the data records according to the variety criterion computed based on the variety measure for the each data record may be configured to select data records associated with respective variety measures indicative of high distinguishability in order to increase diversity of the data records used to compute the digital predistortion parameters.

The digital predistorter may further be configured to compute, for the each data record, the variety measure based on a distance metric representative of distances between data elements of a particular data record, to respective data elements for at least some of the collected data records.

The digital predistorter may further be configured to collect additional data records, store a particular one of the collected additional data records in a records data structure in response to a determination that a variety measure computed for the particular one of the collected additional data records is more distinguishable, relative to previously stored data records available at the records data structure, than one of the previously stored data records, and re-compute, at regular or irregular intervals, the digital predistortion parameters based on the stored data samples available in the records data structure, including the stored particular one of the collected additional data records.

The digital predistorter configured to digitally predistort the subsequent input signals may be configured to derive from a first set of basis functions an expanded set of basis functions of the digital predistorter, the expanded set of basis functions including (d+1) groups of basis functions, with d being representative of a number of parameters of the operating conditions, with a first group of the expanded set of basis functions including the first set of basis functions without any modification, and with each of the remaining d groups of the expanded set of basis functions being determined as a transformation of the first set of basis functions according to a function of at least one of the parameters of the operating conditions. The digital predistorter may further be configured to weigh the expanded set of basis functions with the computed digital predistortion parameters.

In some variations, another method for digital predistortion of signals provided to a radio frequency (RF) transmission path configured to transmit radio signals in a plurality of subbands within a spectral range, is provided. The method includes configuring a digital predistorter for predistorting signals comprising arbitrary spectral content within the spectral range, the configuring including acquiring one or more data samples representing operation of the RF transmission path to transmit radio signals in different subbands, each data sample including a digital input signal provided to the RF transmission path for transmission and a digital sensed signal representing a sensing of a radio transmission in response to the provided digital signal, the each digital input signal representing spectral content concentrated in a respective single corresponding subband within the spectral range, and updating parameters of the digital predistorter according to the acquired one or more data samples to mitigate non-linear characteristics of the RF transmission path. The method further includes receiving a further input signal for transmission by the RF transmission path, the further input signal representing spectral content in a particular subband within the spectral range, and using the configured predistorter to process the further input signal to yield a predistorted signal for providing to the RF transmission path.

Embodiments of the additional method may include at least some of the features described in the present disclosure, including any of the above features of the first method and the first linearization system, as well as one or more of the following features.

The spectral range, W, may include n RF bands of approximately equal-sized bandwidths.

Acquiring the one or more data samples may include controllably adjusting a wireless device comprising the RF transmission path to operate in one or more of the different subbands within the spectral range, and at each of the one or more of the different subbands, measuring at least one set of samples.

Acquiring the one or more data samples may include measuring during runtime, subsequent to an initial computation of the parameters of the digital predistorter, additional sets of samples at additional subbands within the spectral range, and re-updating the parameters of the digital predistorter further based on at least some of the additional sets of samples.

The digital predistorter may be implemented in a user equipment (UE), and the plurality of subbands may be successively assigned bands for transmission.

The updated parameters of the digital predistorter may be configured to weigh basis functions used to predistort the further input signal, with the basis functions including complex terms that depend on a τ-dimensional complex vector q corresponding to complex input samples to the digital distorter, and real terms that depend on a d-dimensional real vector p representative of values of operating conditions associated with operation of the RF transmission path, with d being representative of a number of parameters of the operating conditions associated with the operation of the RF transmission path.

A total number of the basis functions used to digitally predistort input signals may be proportional to the product of a number of terms, b, in a first set of basis functions, and d+1, such that the total number of basis functions is proportional to b·(d+1).

Acquiring the one or more data samples representing the operation of the RF transmission path in the different subbands may further include collecting for the one or more data samples corresponding operating conditions parameters, with the corresponding operating conditions parameters including one or more of, for example, a corresponding temperature of the RF transmission path, a corresponding average power, a corresponding power supply voltage ($V_{DD}$) associated with at least one power amplifier of the RF transmission path, a corresponding Voltage Standing Wave Ratio (VSWR) associated with the RF transmission path, age of the collected each of the sets of samples, and/or corresponding channel information in which the one or more data samples is collected.

Using the configured predistorter to process the further input signal may include predistorting the further input signal according to:

$$v[t] = u[t] + \sum_{k=1}^{n} x_k B_k(q_u[t], p[t]), \text{ where } q_u[t] = \begin{bmatrix} u[t+l-1] \\ \vdots \\ u[t+l-\tau] \end{bmatrix}$$

where $v[t]$ is an output of the digital predistorter at time t, $u[t]$ is an input sample to the digital predistorter at the time t, $B_k$ are the basis functions for k=1 to n, $q_u[t]$ are stacks of input samples, $p[t]$ are d-dimensional real vectors of operating conditions at the time t, and $x_k$ are the computed digital predistortion parameters to weigh the basis functions.

Updating the parameters of the digital predistorter may include deriving, according to an optimization process that is based, at least in part, on the acquired one or more data samples measured in the different subbands, the digital predistortion parameters, $x_k$, to weigh the basis functions $B_k$.

Deriving according to the optimization process the parameters, $x_k$, of the digital predistorter may include adaptively adjusting the digital predistortion parameters, $x_k$, through minimization of a regularized mean square error function $E(x)$ according to:

$$E(x) = \frac{\rho}{n}|x|^2 + \frac{1}{N}\sum_{t \in T}\left|v[t] - y[t] - \sum_{k=1}^{n} x_k B_k(q_u[t], p[t])\right|^2,$$

where $\rho > 0$ is a regularization factor, $v[t]$ is an output of the digital predistorter at the time t, and $y[t]$ is the output of an observation receiver coupled to an output of the RF transmission path.

Adaptively adjusting the digital predistortion parameters, $x_k$, may include deriving correlation matrices G and L, when $n \ll 100$, with n being representative of the number of basis functions, according to:

$$G = \frac{1}{N}\sum_{t \in T} B[t]B[t]', \quad L = \frac{1}{N}\sum_{t \in T}(v[t] - y[t])' B[t], \text{ where}$$

$$B[t] = \begin{bmatrix} B_1(q_y[t], p[t]) \\ \vdots \\ B_n(q_y[t], p[t]) \end{bmatrix};$$

and deriving the digital predistortion parameters, $x_k$, according to:

$$x = \left(\left(\frac{\rho}{n}\right)I + G\right)^{-1} L.$$

Adaptively adjusting the digital predistortion parameters, $x_k$, may include approximating the digital predistortion parameters, $x_k$, according to a stochastic gradient process.

Acquiring the one or more data samples representing operation of the RF transmission path to transmit radio signals in the different subbands may include selecting the one or more data samples from a plurality of data samples according to a variety criterion computed based on the variety measure for the each data record, with the plurality of records being arranged in a variety database structure in which each record corresponds to one of the one or more data samples.

In some variations, an additional linearization system to perform digital predistortion of signals provided to a radio frequency (RF) transmission path configured to transmit radio signals in a plurality of subbands within a spectral range, is provided. The system includes the RF transmission path comprising at least one power amplifier that produces output with non-linear distortions, and a digital predistorter comprising an adaptation section and a compensator. The digital predistorter is configured to configure the compensator to predistort signals comprising arbitrary spectral content within the spectral range, including to acquire one or more data samples representing operation of the RF transmission path to transmit radio signals in different subbands, each data sample including a digital input signal provided to the RF transmission path for transmission and a digital sensed signal representing a sensing of a radio transmission in response to the provided digital signal, the each digital input signal representing spectral content concentrated in a respective single corresponding subband within the spectral range. Configuring the compensator also includes updating parameters of the digital predistorter according to the acquired one or more data samples to mitigate non-linear characteristics of the RF transmission path. The digital predistorter is additionally configured to receive a further input signal for transmission by the RF transmission path, the further input signal representing spectral content in a particular subband within the spectral range, and use the configured compensator to process the further input signal to yield a predistorted signal for providing to the RF transmission path.

Embodiments of the additional linearization system may include at least some of the features described in the present disclosure, including any of the above features for the various methods and for the first linearization system.

The digital predistorter configured to acquire the one or more data samples may be configured to controllably adjust a wireless device comprising the RF transmission path to operate in one or more of the different subbands within the spectral range, and at each of the one or more of the different subbands, measure at least one set of samples.

The digital predistorter configured to acquire the one or more data samples may be configured to measure during runtime, subsequent to an initial computation of the parameters of the digital predistorter, additional sets of samples at additional subbands within the spectral range, and re-update the parameters of the digital predistorter further based on at least some of the additional sets of samples.

The digital predistorter configured to use the compensator may be configured to derive from a first set of basis functions an expanded set of basis functions of the digital predistorter, the expanded set of basis functions including (d+1) groups of basis functions, with d being representative of a number of parameters of operating conditions, with a first group of the expanded set of basis functions including the first set of basis functions without any modification, and with each of the remaining d groups of the expanded set of basis functions being determined as a transformation of the first set of basis functions according to a function of at least one of the parameters of the operating conditions. The digital predistorter may further be configured to weigh the expanded set of basis functions with the updated digital predistortion parameters, to process the further input signal.

The digital predistorter configured to acquire the one or more data samples representing operation of the RF transmission path to transmit radio signals in the different subbands may be configured to select the one or more data samples from a plurality of data samples according to a variety criterion computed based on the variety measure for the each data record, wherein the plurality of records are arranged in a variety database structure in which each record corresponds to one of the one or more data samples.

In some variations, a further method for digital predistortion is provided, that includes obtaining a first set of digital predistortion (DPD) basis functions for controlling operation of a digital predistorter of a wireless device operating on a received at least one input signal directed to a power amplification system comprising a transmit chain with at least one power amplifier that produces output with non-linear distortions, and determining an adapted set of DPD basis functions derived from the first set of DPD basis functions, that depend on operating conditions associated with operation of the wireless device, for controlling the operation of the digital predistorter. The method also includes configuring the digital predistorter with DPD coefficients determined for the adapted set of DPD basis functions based, at least in part, on observed samples of the transmit chain responsive to the at least one input signal.

Embodiments of the further method may include at least some of the features described in the present disclosure, including any of the above features of the first and second methods, and the first and second linearization systems, as well as one or more of the following features.

The basis functions may include complex terms that depend on a τ-dimensional complex vector q corresponding to complex input samples to the digital distorter, and real terms that depend on a d-dimensional real vector p representative of values of the operating conditions associated with the operation of the wireless device on the received at least one input signal, with d being representative of a number of parameters of the operating conditions associated with the operation of the wireless device.

A total number of basis functions used to digitally predistort the at least one input signal may be proportional to the product of a number of terms, b, in the first set of basis functions, and d+1, such that the total number of basis functions is proportional to b·(d+1).

The basis functions may include (d+1) groups of basis functions, with a first group of basis functions including the first set of basis functions without any modification, and with each of the remaining d groups of basis functions determined as the product of the first set of basis functions and one of the operating conditions associated with the wireless device.

Configuring the predistorter with the DPD coefficients may include computing the DPD coefficients according to an optimization process that yields the DPD coefficients, $x_k$, as weights to the basis functions that minimize an error function based on the observed samples of the transmit chain and samples of the at least one input signal.

Computing, according to the optimization process, the DPD coefficients, $x_k$, may include adaptively adjusting the DPD coefficients, $x_k$, through minimization of a regularized mean square error function E(x) according to:

$$E(x) = \frac{\rho}{n}|x|^2 + \frac{1}{N}\sum_{t \in T}\left|v[t] - y[t] - \sum_{k=1}^{n} x_k B_k(q_y[t], p[t])\right|^2, \text{ where}$$

$$q_y[t] = \begin{bmatrix} y[t+l-1] \\ \vdots \\ y[t+l-\tau] \end{bmatrix}$$

where ρ>0 is a regularization factor, $B_k$ are the basis functions for k=1 to n, $q_y[t]$ are stacks of input samples at time t, p[t] are d-dimensional real vectors of the operating conditions at the time t, v[t] is an output of a digital predistortion (DPD) compensator at the time t, and y[t] is the output of an observation receiver coupled to an output of the transmit chain.

Adaptively adjusting the DPD coefficients, $x_k$, may include deriving correlation matrices G and L, when n<<100, with n being representative of the number of basis functions, according to:

$$G = \frac{1}{N}\sum_{t \in T} B[t]B[t]', \; L = \frac{1}{N}\sum_{t \in T}(v[t] - y[t])'B[t], \text{ where}$$

$$B[t] = \begin{bmatrix} B_1(q_y[t], p[t]) \\ \vdots \\ B_n(q_y[t], p[t]) \end{bmatrix};$$

and deriving the DPD coefficients, $x_k$, according to:

$$\bar{x} = \left(\left(\frac{\rho}{n}\right)I + G\right)^{-1} L.$$

Adaptively adjusting the DPD coefficients, $x_k$, may include approximating the DPD coefficients, $x_k$, according to a stochastic gradient process.

The method may further include collecting data records representative of samples of the at least one input signal and respective one or more observed samples of the transmit chain responsive to the samples of the at least one input signal.

Collecting the data records may include collecting the data records in one or more spectral channels, the one or more spectral channels located within a wide band spectral range, with each of the one or more spectral channels having a respective bandwidth smaller than a range bandwidth of the spectral range.

In some variations, a further linearization system to perform digital predistortion is provided that includes a transmit chain comprising at least one power amplifier that produces output with non-linear distortions, and a digital predistorter comprising an adaptation section and a compensator. The digital predistorter is configured to obtain a first set of digital predistortion (DPD) basis functions for controlling operation of the digital predistorter of a wireless device operating on a received at least one input signal, and determine an adapted set of DPD basis functions, derived from the first set of DPD basis functions, that depends on operating conditions associated with operation of the wireless device, for controlling the operation of the digital predistorter. The digital predistorter is also configured to configure the compensator with DPD coefficients determined for the adapted set of DPD basis functions based, at least in part, on observed samples of the transmit chain responsive to the at least one input signal.

Embodiments of the further linearization system may include at least some of the features described in the present disclosure, including any of the above features for the various methods, and for the various linearization systems, as well as one or more of the following features.

The basis functions may include (d+1) groups of basis functions, with a first group of basis functions including the first set of basis functions without any modification, and with each of the remaining d groups of basis functions determined as a transformation of the first set of basis functions according to a function of at least one of the parameters of the operating conditions.

The each of the remaining d groups of basis functions may be determined as the product of the first set of basis functions and one of the operating conditions associated with the wireless device.

The digital predistorter configured to configure the compensator with the DPD coefficients may be configured to compute the DPD coefficients according to an optimization process that yields the DPD coefficients, $x_k$, as weights to the basis functions that minimize an error function based on the observed samples of the transmit chain and samples of the at least one input signal.

The digital predistorter may further be configured to collect data records, representative of samples of the at least one input signal and respective one or more observed samples of the transmit chain responsive to the samples of the at least one input signal, in one or more spectral channels, the one or more spectral channels located within a wide band spectral range, with each of the one or more spectral channels having a respective bandwidth smaller than a range bandwidth of the spectral range.

In some variation, yet another method for digital predistortion is provided that includes collecting data for a wireless device comprising a transmit chain that includes at least one power amplifier that produces output with non-linear distortions. The data includes data records with each data record including input signal data and corresponding output signal data for the transmit chain, and further being associated with a set of operating conditions, with the each data record is associated with a variety measure representative of an extent of distinguishability of the respective data record from other collected data records, and with collecting the data including collecting the data in one or more spectral channels, the one or more spectral channels being located within a wide band spectral range, with each of the one or more spectral channels having a respective bandwidth smaller than a range bandwidth of the spectral range. The method also includes selecting at least some of the data records according to a variety criterion computed based on the variety measure for the each data record, and computing, based on the selected at least some of the data records, digital predistortion parameters used to control a digital predistorter of the wireless device, with computing the digital predistortion parameters including obtaining a first set of digital predistortion (DPD) basis functions for controlling operations of the digital predistorter, determining an adapted set of DPD basis functions, derived from the first set of DPD basis functions, that depend on operating conditions values corresponding to the selected at least some of the data records, and configuring the digital predistorter with the digital predistortion parameters determined for the adapted set of DPD basis functions based, at least in part, on the selected at least some of the data records. The method also includes applying the digital predistorter, configured with the computed digital predistortion parameters, to subsequent input signals.

Embodiments of the yet other method may include at least some of the features described in the present disclosure, including any of the above features for the various methods, and/or for the various linearization systems.

In some variations, systems are provided that are configured to perform one or more of the method steps provided above.

In some variations, a design structure is provided that is encoded on a non-transitory machine-readable medium, with the design structure including elements that, when processed in a computer-aided design system, generate a machine-executable representation of one or more of the systems, digital predistorters, transmit chains, and/or any of their respective modules, as described herein.

In some variations, an integrated circuit definition dataset is provided that, when processed in an integrated circuit manufacturing system, configures the integrated circuit manufacturing system to manufacture one or more of the systems, digital predistorters, transmit chains, and/or any of their respective modules, as described herein.

In some variations, a non-transitory computer readable media is provided that is programmed with a set of computer instructions executable on a processor that, when executed, cause the operations comprising the various method steps described above.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Figure 1:
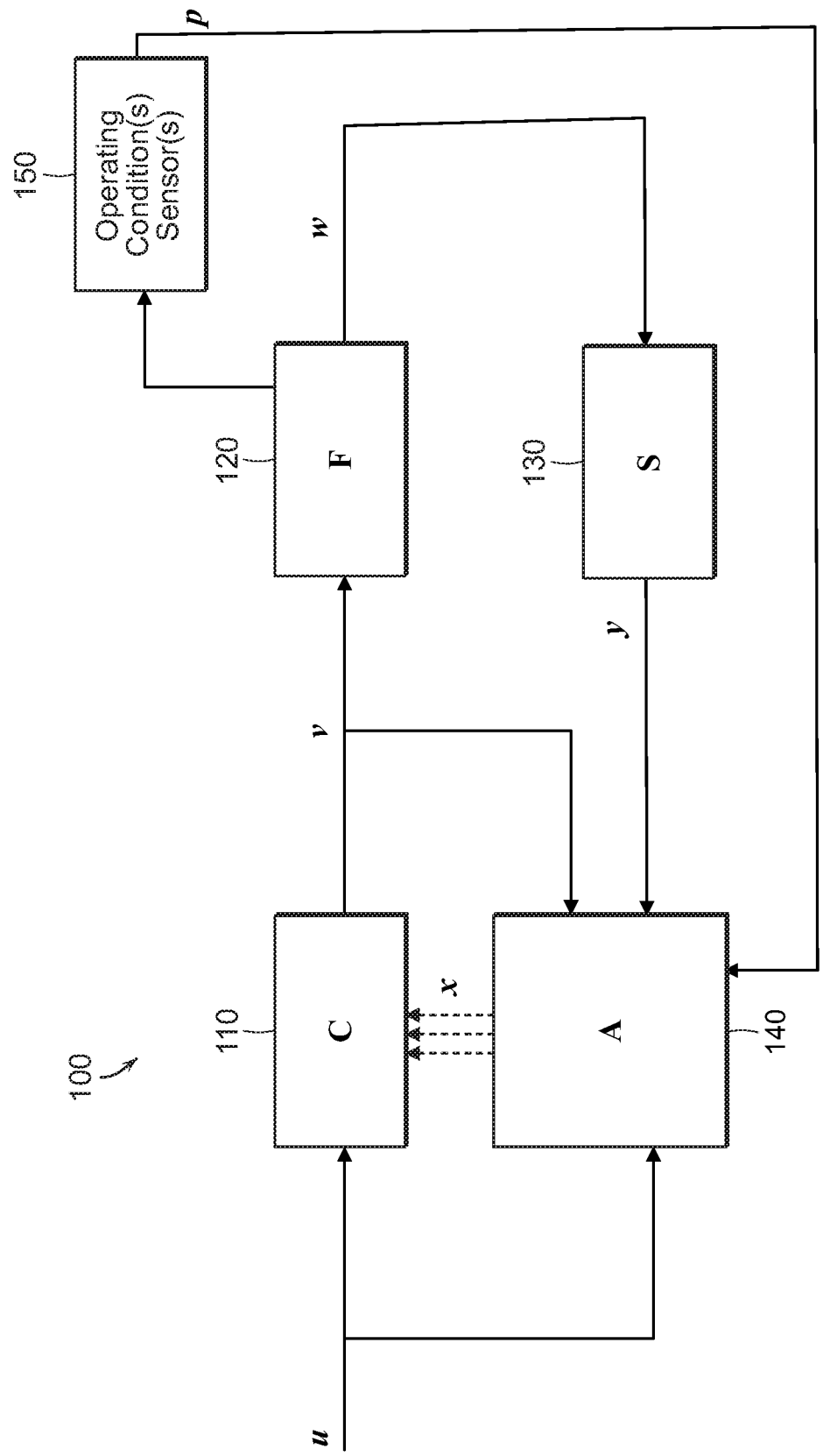
FIG. 1 is a block diagram of a linearization system configured to implement various DPD adaptation approaches as described herein.

Very generally, the following includes a description of a number of techniques that may be used individually, or preferably in combination, to provide a digital predistorter that provides high performance over a wide range of operating conditions, and is able to react to rapid changes between such operating conditions.

These techniques are particularly applicable to radio frequency (RF) user equipment (UE), such as a cellular telephone, that is controlled (e.g., by a base station (BS)) to make use of rapid variations, for example, in spectral positions (e.g., transmission channels or subcarriers), power levels, or output loading. However, it should be understood that the techniques are not limited to implementation on user equipment, and that the techniques may be used on base stations as well. Furthermore, although described in the context of predistortion for over-the-air RF applications, the techniques may be applied to other domains including coaxial cable communication (e.g., for use in DOCSIS standard modems), audio communication (e.g., for linearizing audio, ultrasound, ultra-low frequency), and optical communication (e.g., to mitigate non-linear characteristics of optical communication paths).

A first of these techniques is motivated in part by the varying spectral position of a transmit spectrum. In this technique, generally, a predistorter is configured to process input signals that span a relatively narrow subband within a wider available bandwidth, and is "universal" in the sense that it is largely or completely agnostic to the location and/or width of the particular subband in which the transmitter is operating at any given time. It should be recognized that one challenge for this technique is that data available to adapt the predistorter is sparse, in the sense that feedback available to update the parameters of the predistorter only sense characteristics over a small fraction of the overall available bandwidth at any one time.

A second of these techniques explicitly accounts for changes in certain aspects of the operating conditions by introducing parameters representing those aspects, and incorporating dependency on those parameters into the model structure of the predistorter. Using this approach, a change in one of these aspects involves changing the value of the corresponding parameter of the predistorter model without having to wait for a slower adaptation procedure to react to the change in the aspect of the operating condition. As an example, the dependence on transmission power may be parameterized, and the predistorter can react to changes in power virtually instantaneously. In another example, the basis functions, which are generally a function of the desired input, that are used to predistort input signals can be further adapted based on changes to operating conditions.

In example implementations of the second technique, a method for digital predistortion is provided that includes obtaining a first set of digital predistortion (DPD) basis functions for controlling operations of a digital predistorter, of a wireless device, operating on at least one input signal directed to a power amplification system comprising a transmit chain with at least one power amplifier that produces output with non-linear distortions. The method additionally includes determining an adapted set of DPD basis functions, derived from the first set of DPD basis functions, that depend on operating conditions (e.g., including environmental parameters) associated with operation of the wireless device, for controlling operation of the digital predistorter, and configuring the digital predistorter with DPD coefficients determined for the adapted set of DPD basis functions based, at least in part, on observed samples of the transmit chain responsive to the at least one input signal.

A third of these techniques addresses the possibility that during operation, the range of operating conditions is not made use of in a representative manner, or follows a time pattern that may result in adaptation of the predistorter to degrade its ability to change to a new operating condition that may be underrepresented in its influence on the configuration of the predistorter. Very generally, the technique makes use of a sampling of operational data based on which the configuration is adapted that maintains an adequate diversity over the possible operating conditions, thereby providing good performance immediately after a change from one configuration to another.

In example implementations of the third type of techniques, digital predistortion adaptation is implemented using data samples selected according to variety metrics. In some such implementations, a method for digital predistortion is provided that includes collecting data for a wireless device comprising a transmit chain that includes at least one power amplifier that produces output with non-linear distortions. The collected data includes data records, with each data record including input signal data and corresponding output signal data for the transmit chain, and further being associated with a set of operating conditions values. Each data record is also associated with a variety metric representative of an extent of distinguishability of the respective each data record from other collected data records. Examples of such a variety metrics include distance metrics between elements of different records (large distances are generally indicative of high distinguishability between such different records), with one example of such distance computation being the maximal absolute value of differences between the corresponding elements of the data records. The method additionally includes selecting at least some of the data records according to a variety criterion computed based on the variety metric for the each data record, computing, based on the selected at least some of the data records, digital predistortion parameters used to control a digital predistorter of the wireless device, and applying the digital predistorter, configured with the computed digital predistortion parameters, to subsequent input signals.

The techniques outlined above are described below in the context of a predistortion system 100 shown in block diagram form in FIG. 1. In FIG. 1, u is an input signal that represents a desired signal to be transmitted via a transmission section F 120. The signal u comprises a sequence . . . , $u[t-1]$, $u[t]$, $u[t+1]$, . . . of complex I/Q samples provided to the system 100 in digital form. As introduced above, this input signal in general occupies a relatively small part of an overall available bandwidth of the system. However, through implementation of an adaptation process that uses samples collected over a large number of diverse bands/subbands within the available bandwidth (e.g., the range of frequencies of a set of available communication channels) of the system (i.e., the implementation referred to as the First Technique, as further discussed in greater detail below), the adaptive DPD compensation system 100 can be realized as a universal DPD compensator configured to can operate at different spectral bands (e.g., within a broad spectral range, W, that includes bands operated by correspond to different commercial cellular operators, different available commercial bands, different cellular technologies, etc.). The techniques are also applicable for use with similar systems described in PCT Application No. PCT/US2019/031714, filed on May 10, 2019, titled "Digital Compensation for a Non-Linear System," U.S. application Ser. No. 16/004,594, titled "Linearization System," filed on Jun. 11, 2018, and U.S. application Ser. No. 16/004,713, titled "Multi-Band Linearization System," filed on Jun. 11, 2018, which are each incorporated herein by reference.

A compensator C 110 is electrically coupled to the transmission section F 120 that represents the signal chain from a digital signal (at baseband, or possibly at in intermediate frequency band) to a radio frequency signal provided to, or emitting from, an antenna, including components such a modulators, power amplifier, analog transmission line, and the like, which can introduce non-linear characteristics into the signal path. The transmission section F 120 (also referred to as transmission chain or transmit chain) implements a digital-to-analog subsystem that includes, for example, a DAC/PA combination. In wireless implementations, the transmission section F 120 also includes a modulator (e.g., implemented using a local oscillator) to allow transmission of a resultant analog signal within some RF band within the spectral range W that the system 100 is configured to operate in. The particular band may be selected and/or adjusted (e.g., during hand-off operations) according to availability of cellular resources (e.g., available RF communication bands).

The compensator (also referred to as the digital predistorter) C 110, is configured to compensate for non-linear characteristics of the transmission section F 120 (such non-linear behavior may be caused by operation of one or more of the components of the transmission section 120, such as the power amplifier, the DCA, the modulator, etc.) In particular the predistorter receives the desired signal u and outputs a corresponding predistorted signal v, which is a function of u, where this function is parameterized by configuration parameters x. A sensing section S 130 (also referred to as the observation path) senses the output of the transmission section F 120, and provides a sensed signal y in digital form. Ideally, the sensed signal y is the same (or a scaled, e.g., amplified, version) as the desired input u if the predistorter 110 is able to exactly invert all the non-linear effects of the transmission section. The sensing section S 130 implements an analog-to-digital sub-system, representing real time output measurement (e.g., a demodulator/ADC combination) of the output, w, of the transmission section F 120. The block S 130 produces observed digital samples denoted as the signal y. In some embodiments, at least a batch of the observed samples is stored in a memory device (e.g., a buffer or a bank of buffers) that is in electrical communication with at least one of the subsystems of the system 100.

An adaptation section A 140 (also referred to as an adapter) receives the desired signal u and the sensed signal y and determines the predistortion parameters x that are used in order to approach the ideal situation in which y is the same as u. As will be discussed in greater detail below, in some example embodiments, the system 100 is configured to derive and apply a predistortion process that uses adaptive basis functions that are based on the operating conditions (e.g., environmental characteristics) of the system 100. In at least some combinations of techniques that explicitly model aspects of the operating conditions, the adaptation section receives operating parameters p, for example provided by a controller of the system, or sensed by sensing devices/sections 150 (schematically depicted in FIG. 1 as sensing characteristics of the transmission section 120, recognizing that this is only one possible source of such operating conditions). Such sensing devices can include, for example, a temperature sensor, current and/or voltage sensors, RF power meter, circuit and/or processor-based devices that derives operating condition parameters (such as the voltage standing wave ratio, or VSWR, values indicative of records' age, such as timestamps), etc.

More particularly, samples of the intermediary signal v and the observed samples y are provided to the adaptation section 140 A, which implements an adaptation process (e.g., an optimization process, a coefficient selection process to select pre-determined coefficients from a look-up table, a coefficient interpolation process, etc.) to derive a vector x of the weighing coefficients of the basis functions applied by the compensator C 110, based on the data obtained for v, and y (and, in some instances, u). The observed samples y, as well as the intermediary samples v and/or the input samples u, may all be stored in a buffer (not shown, which may be part of any of the sub-systems of the system 100). The content of the buffer (which may be arranged as a matrix, or may be arranged according to some other appropriate data structure) may be occasionally updated as new samples, that are deemed to be more useful for the adaptation process (because they are more recent and/or meet some data criterion such as data uniformity) become available.

In at least some implementations, the compensator (predistorter) C 110 implements a non-linear transformation that may be represented as:

$$v[t] = u[t] + \sum_{k=1}^{n} x_k B_k(q_u[t], p[t]).$$

In this equation, $q_u[t]$ is a window of $\tau$ past input values $$q_u[t] = \begin{bmatrix} u[t+l-1] \\ u[t+l-2] \\ \vdots \\ u[t+l-\tau] \end{bmatrix}$$

and p[t] is a vector (or scalar) representing aspects of the current operating condition. Note that in versions that do not explicitly model such aspects, the dependence on p[t] may be omitted. The parameters x shown in FIG. 1 comprise a vector of n complex-values parameters $x_k$.

The terms $B_k(q, p)$ are referred to as "basis functions," which can output scalar complex valued function of the inputs q and p. A variety of such functions may be used, for example, as described in PCT Application No. PCT/US2019/031714, filed on May 10, 2019, titled "Digital Compensation for a Non-Linear System." Note that the number of samples in $q_u$ depends on the basis functions used according to the maximum lag $\tau$ used by any of the basis functions. Very generally, in some embodiments, the basis functions $B_k$ may be selected during operation according to the operating conditions, and the adaption section A 140 modifies (i.e., adapts) the parameters x (which weigh the basis functions) as new data samples v and y are made available to it, e.g., in an incremental updating process. One or more such processes are described later in this document. Thus, the adaptive DPD compensation system 100 may be configured to adaptively determine DPD coefficients (e.g., selected from a lookup tables/matrices containing pre-determined DPD coefficients associated with different operating points, or dynamically derived according to current and previously obtained samples).

As noted, in some example approaches, the basis functions may be adaptable functions that vary according to operating conditions, thus providing a larger number and variety of basis functions beyond an initial set of carefully pre-selected basis functions. Thus, in some examples, the adaptability of the basis functions used for the predistortion operations can be made dependent on a vector p representing d operating conditions that is introduced into the predistortion model by essentially introducing a linear dependence on each of these terms. This can be represented by a replacement of $x_k B_k(q, p)$ with $x_{3(k-1)+1} B_{k0}(q) x_{3(k-1)+2} B_{k0}(q) p_1 + \ldots + x_{3(k-2)+d+1} B_{k0}(q) p_d.$ Therefore, the number terms in the adapted parameters x goes up by a factor of d+1. In this example, the complexity of basis functions remains unchanged because the same basis function $B_{k0}$ is used for a group of (d+1) terms. In other implementations, different basis functions may be used for each of the aspects of the operating conditions, such that these basis functions may depend, in part, on contemporaneous environmental parameters values measured/determined during the adaptation process, with the number of total basis functions used to digitally predistort the input samples being dependent on the number of operating conditions used. For example, if two environmental parameters (e.g., temperature and VDD) are measured for collected samples, the number of basis functions used for the digital predistortion process will be three (3) times the number of basis functions used in implementation that do not incorporate environmental parameters (or other types of operation conditions) into the adaptation process.

As noted above, and as will be discussed in greater detail below, the system 100 may also be configured for more robust and efficient adaptability through implementation of a variety matrix adaptation approach (the "third technique" referred to above). In such an approach, past samples of $(q_u[t], u[t]-y[t], p[t])$, or, for certain adaptation procedures $(q_y[t], v[t]-y[t], p[t])$, are not used with a uniform distribution over past points in time. One implementation of such non-uniform sampling is to maintain a buffer V of a subset of past samples. This buffer of samples $(q^{(i)}, v^{(i)}, p^{(i)})$ is maintained by the system to represent a diversity of past operating conditions, without overrepresenting any particular condition. Generally, when a new time sample $(q[t], v[t], p[t])$ is made available to the adaptation section, the adaption section A 140 determines whether to retain this time sample in the buffer V, and if so, which current entry in the buffer to eject.

One general approach to determining whether to eject a current sample and replace it with the new time sample is to do so if such a replacement can increase the diversity or uniformity of the sampling of operating conditions in the buffer. For example, an easy-to-compute distance between data samples is defined as the maximum absolute difference between components of the data sample, for each data i in the buffer. In general, it is desirable to have data points in the buffer have as large as possible a minimum distance between data points in order to cover a larger hyperspace, thus promoting diversity in the overall buffer. The new time sample similarly has a minimum distance $h_i$ to the data points in the buffer. The data sample with the smallest value of $\min(r_i, h_i)$ is then ejected and replaced with the new sample. In the adaptation procedure, the updated buffer V is used to update the predistortion parameters x.

As noted, the adaptation section A 140 is configured to compute the DPD coefficients that weigh basis functions applied to the input signal u[t] by the compensator C 110. In at least some examples, the parameters x of the predistorter are updated using an iterative updating procedure, for instance, using a stochastic gradient procedure. In other examples, the parameters x are updated in a batch procedure, for example, using a Gramian matrix inversion procedure.

In the iterative procedure, an objective is to optimize (i e, minimize) an objective $$E(x) = \frac{\rho}{N}|x|^2 + \frac{1}{N}\sum_{t \in T}\left|e[t] - \sum_{k=1}^{n} x_k B_k(q_y[t], p[t])\right|^2$$

where $e[t] = v[t] - y[t]$

The sum is either over past time samples, or in the case of use of the buffer V, over the time samples represented in the buffer.

In a stochastic gradient approach, uniformly randomly selected times τ are selected and the current parameters values x are updated as $x \to x - \alpha \nabla V_\tau(x)$ where $V_\tau(x) = a[\tau](a(\tau)x - e[\tau])$ and $a(\tau) = [B_1(q_y[t], p[t]), \ldots, B_N(q_y[t], p[t])]$ The step size α may be adjusted (e.g., reduced) over time. Further details regarding the various optimization procedures that may be used in conjunction with the system 100 and the implementations of one or more of the agile adaptation techniques described herein are provided below.

Turning back to FIG. 1, the system 100 illustrated in FIG. 1 may be at least part of a digital front end of a device or system (such as a network node, e.g., a WWAN base station or a WLAN access point, or of a mobile device). As such, the system 100 may be electrically coupled to communication modules implementing wired communications with remote devices (e.g., via network interfaces for wired network connection such as through ethernet), or wireless communications with such remote devices. In some embodiments, the system 100 may be used locally within a device or system to perform processing (predistortion processing or otherwise) on various signals produced locally in order to generate a resultant processed signal (whether or not that resultant signal is then communicated to a remote device).

In some embodiments, at least some functionality of the linearization system 100 may be implemented using a controller (e.g., a processor-based controller) included with one or more of the modules of the system 100 (the compensator C 110, the adaptation section A 140, or any of the other modules of the system 100). The controller may be operatively coupled to the various modules or units of the system 100, and be configured to compute approximations of the gradient of the Error function (as will be discusses in greater detail below), update DPD coefficients based on those approximations, and perform digital predistortion using the continually updated DPD coefficients. The controller may include one or more microprocessors, microcontrollers, and/or digital signal processors that provide processing functionality, as well as other computation and control functionality. The controller may also include special purpose logic circuitry, e.g., an FPGA (field programmable gate array), an ASIC (application-specific integrated circuit), a DSP processor, a graphics processing unit (GPU), an accelerated processing unit (APU), an application processor, customized dedicated circuitry, etc., to implement, at least in part, the processes and functionality for the system 100. The controller may also include memory for storing data and software instructions for executing programmed functionality within the device. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc.

The approaches outlined can be used separately or in conjunction with any of the other DPD adaptation approaches discussed herein. Thus, for example, an embodiment of the approaches and techniques described herein include a method for digital predistortion comprising collecting data for a wireless device comprising a transmit chain that includes at least one power amplifier that produces output with non-linear distortions, the data including data records with each data record including input signal data and corresponding output signal data for the transmit chain and further being associated with a set of operating conditions. The each data record is associated with a variety metric representative of an extent of distinguishability of the respective data record from other collected data records. Collecting the data includes collecting the data in one or more spectral channels, the one or more spectral channels located within a wide band spectral range, with each of the one or more spectral channels having a respective bandwidth smaller than a range bandwidth of the spectral range. The method further includes selecting at least some of the data records according to a variety criterion computed based on the variety metric for the each data record, and computing, based on the selected at least some of the data records, digital predistortion parameters used to control a digital predistorter of the wireless device. Computing the digital predistortion parameters includes obtaining a first set of digital predistortion (DPD) basis functions for controlling operations of the digital predistorter, determining an adapted set of DPD basis functions, derived from the first set of DPD basis functions, that depend on operating conditions values corresponding to the selected at least some of the data records (for example, averages of corresponding operating condition values from each of the selected records may be computed), and configuring the digital predistorter with the digital predistortion parameters determined for the adapted set of DPD basis functions based, at least in part, on the selected at least some of the data records. The method additionally includes applying the digital predistorter, configured with the computed digital predistortion parameters, to subsequent input signals.

Additional details regarding the various agile adaptation techniques described herein follow.

First Technique: Wideband Adaptation Based on Narrow Band Measurements

As discussed herein, agile estimation of digital predistortion (DPD) parameters may be achieved with a universal parametrized digital predistorter, operable over a wideband spectral range, W, that can be implemented based on samples collected over portions of the wideband spectral range (e.g., based on samples collected in narrow subbands of the spectral range) at different time intervals. Such samples can be collected using an adjustable narrow band wireless communication device (configured to operate in different subbands within the spectral range).

Thus, in some embodiments, a method for digital predistortion of signals, provided to a radio frequency (RF) transmission path (e.g., the transmission section F 120) configured to transmit radio signals in a plurality of subbands within a spectral range, is disclosed. The method includes configuring a digital predistorter (such as the compensator C 110 of FIG. 1) for predistorting signals comprising arbitrary spectral content within the spectral range. The configuring includes acquiring one or more data samples representing operation of the RF transmission path to transmit radio signals in different subbands, with each data sample including a digital input signal provided to the RF transmission path for transmission, and a digital sensed (e.g., sensed by the sensing section S 130) signal representing a sensing of a radio transmission in response to the provided digital signal. Each digital input signal represents spectral content concentrated in a respective single corresponding subband within the spectral range (e.g., being concentrated or confined to a defined frequency range for a single communication channel or sub-carrier). Configuring the digital predistorter further includes updating parameters of the digital predistorter (e.g., through an adaptation procedure generally realized using the adaptation section A 140) according to the acquired one or more data samples to mitigate non-linear characteristics of the RF transmission path. The procedure further includes receiving a further input signal for transmission by the RF transmission path, the further input signal representing spectral content in a particular subband within the spectral range, and using the configured predistorter to process the further input signal to yield a predistorted signal for providing to the RF transmission path.

Thus, in implementations of the first technique, a universal parametrized predistorter is realized that is robust to changing spectral conditions. That is, in the approach of the first technique, a single predistorter implementation may be realized that can operate at different sub-carriers, and does not necessarily have to adapt to new spectral conditions as a channel's spectral characteristics (carrier frequency, bandwidth, communication protocols uses, average output power, etc.) change (for example, as a result of moving to a different cell, changing to a different band within the same cellular area due to changes caused by base station assignments, etc.) Because spectral characteristics can change frequently, using a robust universal digital predistorter configured to operate over the entire spectral range, W, can reduce computation complexity that would result from having to adapt to every change in spectral operating conditions.

To realize a universal parametrized digital predistorter, samples from subbands of the spectral range (i.e., bands within the spectral range, W, that have bandwidths narrower than the bandwidth W associated with the spectral range) are collected. The collection of samples can be performed at design time through a methodical traversal of the spectral range, or may be collected during normal operation of the wireless device (comprising the digital predistorter) as the wireless device hops from one subband to another, depending on the specific use of the wireless device, availability of spectral resources (e.g., whether some available bands are assigned to other wireless devices), and existing environmental conditions. When the wireless device (comprising a digital predistortion system such as the system 100 of FIG. 1) dynamically collects samples during normal operation, and occasionally (at regular or irregular intervals) updates DPD parameters, collected samples may be stored in a variety matrix such as the one described herein (i.e., to collect samples that promote sample diversity) along with operating conditions (that may include spectral operating conditions). Occasionally, the digital predistortion system uses the currently stored records to update the DPD coefficients. The updated coefficients would, in such examples, reflect a good variety of samples, including possible a variety of samples collected from diverse subbands. Alternatively, the wireless device may collect samples according to some other scheme that obtains representative samples obtained for multiple subbands.

Figure 2:
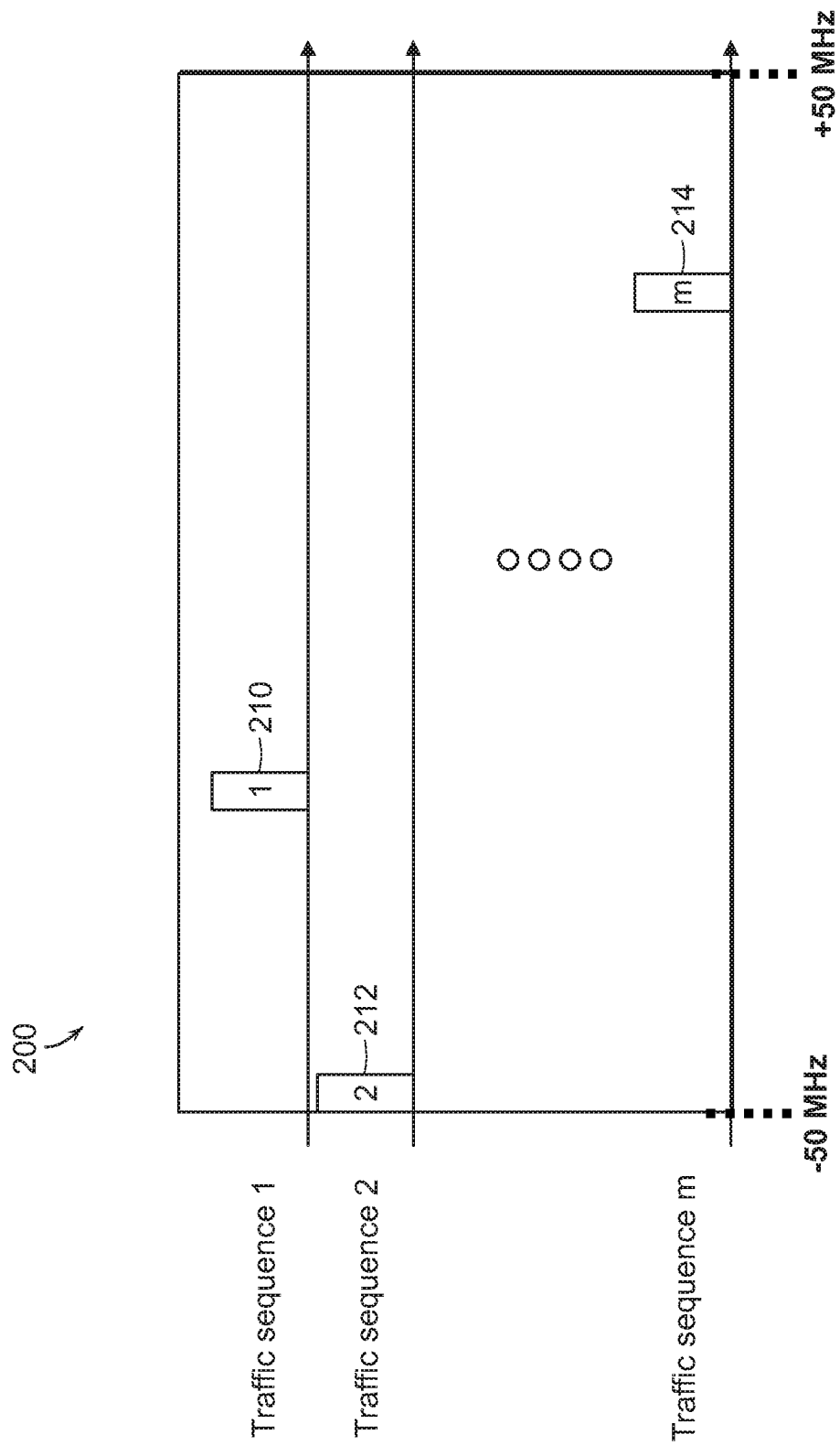
FIG. 2 is a diagram illustrating collection of samples from narrow subbands of a wideband spectral range.

With reference to FIG. 2, a diagram 200 illustrating collection of samples from narrow subbands (210, 212, and 214) of a wideband spectral range having a bandwidth of 100 MHz is provided. In this diagram, the wireless device hops (or systematically slides) into different subbands, and collects samples from the narrowband subbands. In addition to input samples (and/or observed samples), the operating conditions, which may include spectral information, can be collected and selectively stored (e.g., based on computed variety metrics, according to which a decision is made on whether particular samples should be stored or discarded). Occasionally, at regular or irregular intervals, the adaptation process uses the narrowband samples to generate or update the predistortion parameters, e.g., DPD coefficients that weigh the basis functions (which may be adaptive basis functions, as described herein). Sample data collection can be performed, in some embodiments, by sampling input (and/or observed output of the transmission chain) at full wideband bandwidth (i.e., at the Nyquist frequency for the spectral range W) or at the narrower bandwidth of the subband (optionally upsampling the collected samples during, for example, the DPD parameter updating procedure).

Figure 3:
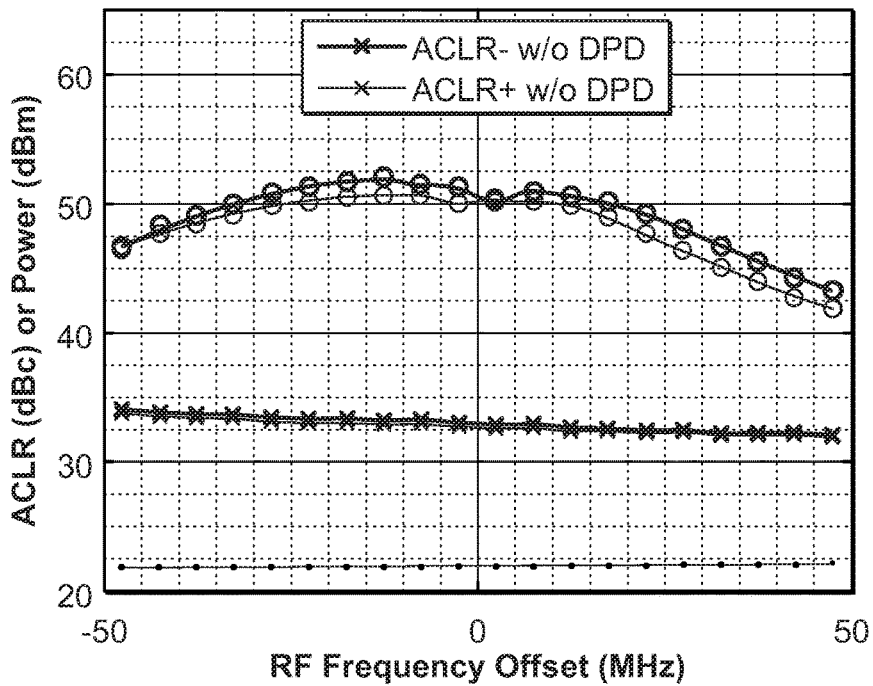
FIG. 3 includes graphs comparing the performance results of DPD compensation systems implemented using two different approaches (namely, a wideband sample collection approach, and narrow subbands sample collection approach).
Figure 3:
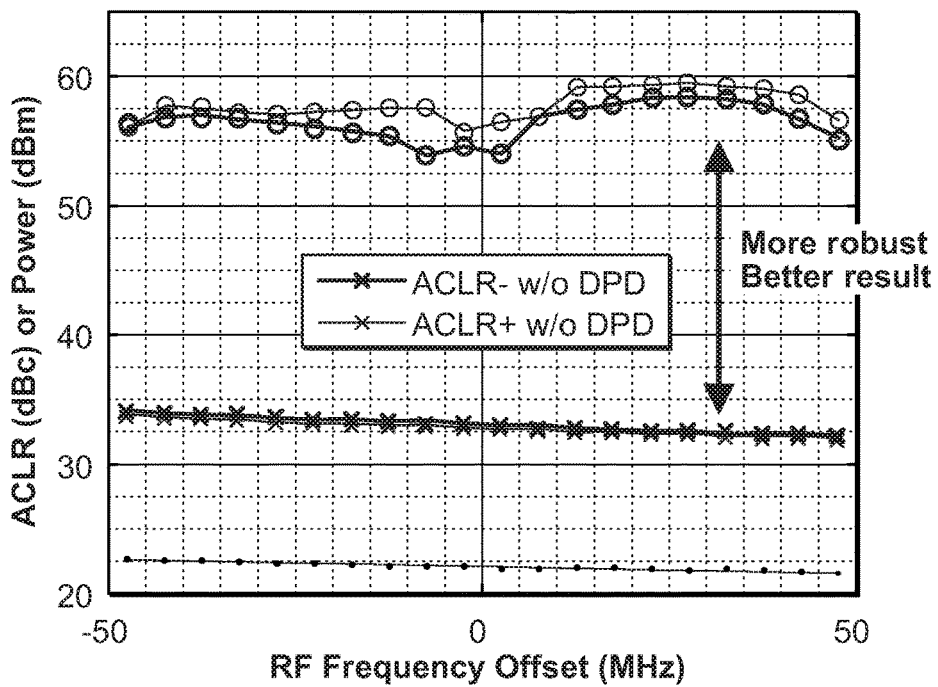

FIG. 3 includes graphs 310 and 320 comparing the performance results of DPD compensation systems that were implemented using two different approaches. In the first implementation, corresponding to the graph 310, the DPD coefficients were generated using wideband signal samples (i.e., the DPD system was trained using samples of a wideband signal). In the second implementation, corresponding to the graph 320, DPD coefficients were generated using samples collected from multiple narrow-band subbands. In the implementations corresponding to the graphs 310 and 320, derivation of the DPD coefficients was performed by accumulating and averaging new and old correlation matrices. As the two graphs 310 and 320 show, the DPD system trained using samples from multiple narrowband subbands achieved a generally higher and more robust performance (based on the Adjacent Channel Leakage Ratio, or ACLR, behavior for the two implementations).

Figure 4:
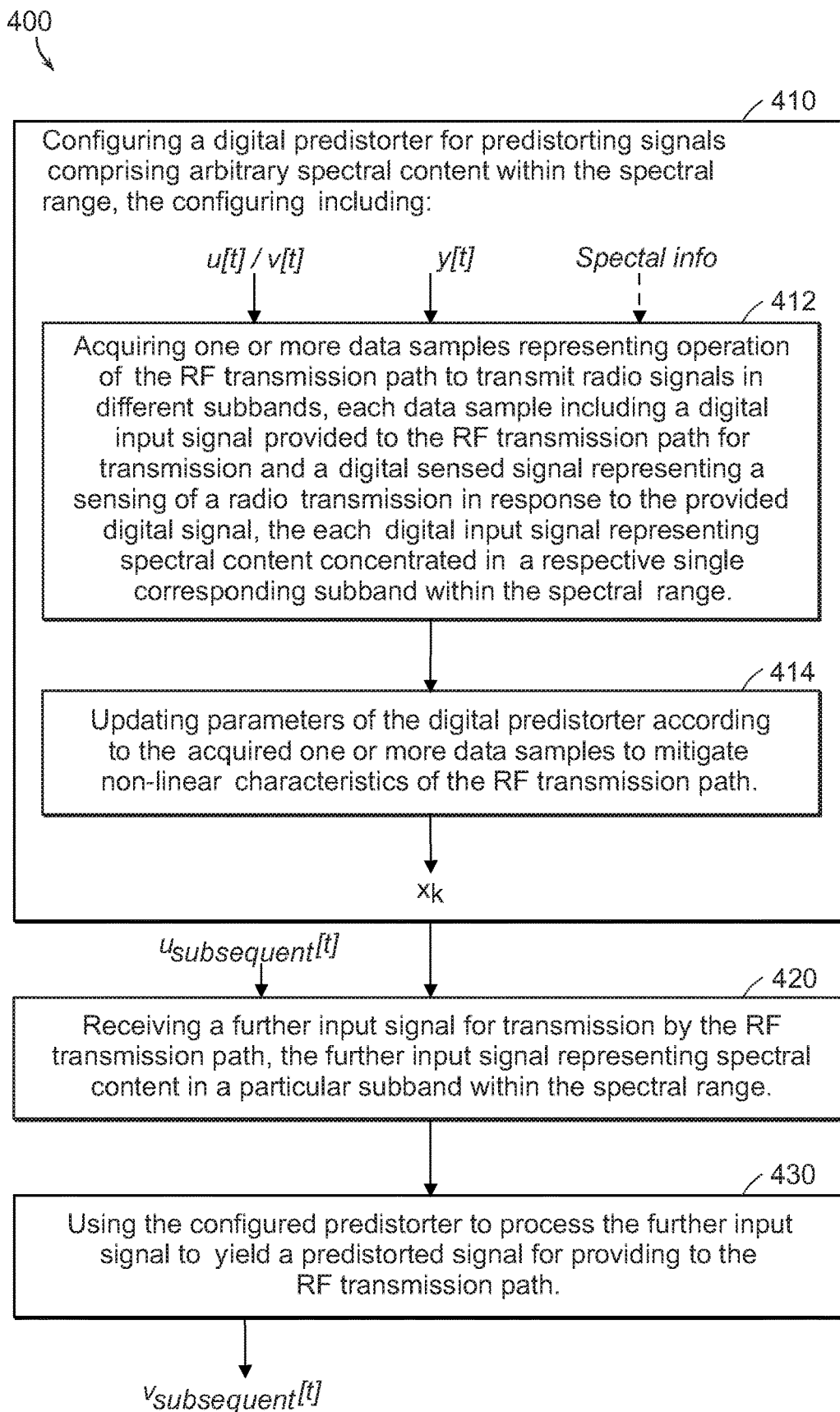
FIG. 4 is a flowchart of an example procedure for digital predistortion for a radio frequency (RF) transmission path configured to transmit radio signals in a plurality of subbands within a spectral range.

With reference next to FIG. 4, a flowchart of an example procedure 400 for digital predistortion of signals provided to a radio frequency (RF) transmission path, configured to transmit radio signals in a plurality of subbands within a spectral range, is shown. The procedure 400 includes configuring 410 a digital predistorter (such as the one realized by the system 100 of FIG. 1) for predistorting signals comprising arbitrary spectral content within the spectral range. The configuring operations 410 of the procedure 400 include acquiring 412 one or more data samples representing operation of the RF transmission path to transmit radio signals in different subbands. Each data sample includes a digital input signal (e.g., u[t] and/or v[t] shown in FIG. 1, and also illustrated in FIG. 4) provided to the RF transmission path for transmission and a digital sensed signal (e.g., y[t] shown in FIGS. 1 and 4) representing a sensing of a radio transmission in response to the provided digital signal. Each digital input signal represents spectral content concentrated in a respective single corresponding subband within the spectral range. The spectral information corresponding to the subband is shown in FIG. 4 as information that can optionally be provided for the purposes of the adaptation process. That spectral information can also be provided as part of the p[t] data depicted in FIG. 1. Thus, in some embodiments, acquiring the one or more data samples representing the operation of the RF transmission path in the different subbands may further include collecting for the one or more data samples corresponding operating conditions parameters, with the corresponding operating conditions parameters including one or more of, for example, a corresponding temperature of the RF transmission path, a corresponding average power, a corresponding power supply voltage ($V_{DD}$) associated with at least one power amplifier of the RF transmission path, a corresponding Voltage Standing Wave Ratio (VSWR) associated with the RF transmission path, age of the collected each of the sets of samples, and/or corresponding channel information in which the one or more data samples is collected. In some examples, the spectral range, W, includes n RF bands of approximately equal-sized bandwidths.

In some embodiments, acquiring the one or more data samples may include controllably adjusting a wireless device comprising the RF transmission path to operate in one or more of the different subbands within the spectral range (e.g., by controlling he modulation/demodulation functionality through adjustment of a local oscillator, adjusting bandpass filtering operations, etc.), and, at each of the one or more of the different subbands, measuring at least one set of samples. Acquiring the one or more data samples may include measuring during runtime, subsequent to an initial computation of the parameters of the digital predistorter, additional sets of samples at additional subbands within the spectral range, and updating the parameters of the digital predistorter further based on at least some of the additional sets of samples. In some embodiments, acquiring the one or more data samples representing operation of the RF transmission path to transmit radio signals in different subbands may include selecting the one or more data samples from a plurality of stored data samples according to a variety criterion computed based on the variety metric for the each data record, with the plurality of records being arranged in a variety database structure in which each record corresponds to one of the one or more data samples.

The configuring operation 410 also include updating 414 parameters of the digital predistorter (e.g., DPD coefficients that weigh basis functions) according to the acquired one or more data samples to mitigate non-linear characteristics of the RF transmission path. For example, in some embodiments, the basis functions are adaptive basis functions (basis functions that can be expanded from a base set, according to, for example, operating conditions) that include complex terms that depend on a τ-dimensional complex vector q corresponding to complex input samples to the digital distorter, and real terms that depend on a d-dimensional real vector p representative of values of operating conditions associated with operation of the RF transmission path. The value d is representative of a number of parameters of the operating conditions associated with the operation of the RF transmission path. In such embodiments, a total number of the basis functions used to digitally predistort input signals is proportional to the product of a number of terms, b, in a first set (i.e., a base set) of basis functions, and d+1, such that the total number of basis functions is proportional to b·(d+1).

With continued reference to FIG. 4, the procedure 400 further includes receiving 420 a further input signal (shown as the signal $u_{subsequent}[t]$ in FIG. 4) for transmission by the RF transmission path, with the further input signal representing spectral content in a particular subband within the spectral range. The procedure 400 additionally includes using 430 the configured predistorter (configured according to the operations 410) to process the further input signal to yield a predistorted signal (shown in FIG. 4 as $v_{subsequent}[t]$) for providing to the RF transmission path.

In some examples, using the configured predistorter to process the further input signal may include predistorting the further input signal according to:

$$v[t] = u[t] + \sum_{k=1}^{n} x_k B_k(q_u[t], p[t]),$$

$$\text{where } q_u[t] = \begin{bmatrix} u[t+l-1] \\ \vdots \\ u[t+l-\tau] \end{bmatrix}$$

where v[t] is an output of the digital predistorter at time t, u[t] is an input sample to the digital predistorter at the time t, $B_k$ are the basis functions for k=1 to n, $q_u[t]$ are stacks of input samples, p[t] are d-dimensional real vectors of operating conditions (e.g., environmental characteristics) at the time t, and $x_k$ are the computed digital predistortion parameters to weigh the basis functions.

Updating the parameters of the digital predisorter may include deriving, according to an optimization process that is based, at least in part, on the acquired one or more data samples measured in the different subbands, the digital predistortion parameters, $x_k$, to weigh the basis functions $B_k$. In some examples, deriving according to the optimization process the parameters, $x_k$, of the digital predistorter may include adaptively adjusting the digital predistortion parameters, $x_k$, through minimization of a regularized mean square error function $E(x)$ according to:

$$E(x) = \frac{\rho}{n}|x|^2 + \frac{1}{N}\sum_{t \in T}\left|v[t] - y[t] - \sum_{k=1}^{n}x_k B_k(q_u[t], p[t])\right|^2,$$

where $\rho > 0$ is a regularization factor, $v[t]$ is an output of the digital predistorter at the time t, and $y[t]$ is the output of an observation receiver coupled to an output of the RF transmission path.

Adaptively adjusting the digital predistortion parameters, $x_k$, may include, for example, deriving correlation matrices G and L, when n<<100, with n being representative of the number of basis functions, according to:

$$G = \frac{1}{N}\sum_{t \in T}B[t]B[t]', \quad L = \frac{1}{N}\sum_{t \in T}(v[t] - y[t])'B[t],$$

where $B[t] = \begin{bmatrix} B_1(q_y[t], p[t]) \\ \vdots \\ B_n(q_y[t], p[t]) \end{bmatrix}$, and deriving the digital predistortion parameters, $x_k$, according to $$\bar{x} = \left(\left(\frac{\rho}{n}\right)I + G\right)^{-1}L.$$

In the above expression, $\bar{x}$ is a column vector of the complex conjugated $x_k$.

Adaptively adjusting the digital predistortion parameters, $x_k$, may include, in some embodiments, approximating the digital predistortion parameters, $x_k$, according to a stochastic gradient process.

Second Technique: Parameterized Digital Predistortion Basis Functions

As noted, the coefficients derived by the adaptation section A 140 are used to weigh the basis functions used by compensator (predistorter) C 110 to predistort the input u. Predistorting the signal u, by the compensator C 110 requires, in some embodiments, minimizing the difference between y (the output of the sensing section S 130) and u (the input samples) as small as possible. To add agility and versatility to the predistortion operations, some example embodiments described herein utilize a set of adaptable basis functions to build an expanded set of functions based on contemporaneous operating conditions. In other words, as the operating conditions (e.g., environmental characteristics) change, the particular set of basis functions operating on the input samples is adjusted in accordance with the existing operating conditions.

An example approach that uses an adapted set of basis functions that depends on operating conditions (to achieve agile estimation of DPD parameters, improve responsiveness speed to changing conditions, and increase robustness of the DPD system) is based on deriving an adapted set of basis functions from an initial/first set of DPD basis functions. The first set of DPD functions may be a pre-determined, carefully selected set of functions $B_k(\cdot)$ that is dependent on the input samples to the DPD system (and is configured to provide good DPD performance, e.g., for a particular transmit chain or wireless device), but is independent of operating conditions. Thus, the initial (base) set of basis functions (from which descendent/derivative sets of basis functions can be spawned) comprises terms that are applied to input samples to the DPD system (i.e., u[t−k], . . . , u[t−1], u[t], u[t+1], . . . ). Spin-off (child or derivative) basis functions can then be constructed using the initial set of functions, with added terms that are functions of the operating conditions (e.g., parameters representative of environmental characteristics). As a result, the size of adaptive sets of basis functions increases as more terms dependent on operating conditions are added to the initial (base) set of basis functions.

A common representation of the compensator C 110 (of FIG. 1) is given by:

$$v[t] = u[t] + \sum_{k=1}^{n}x_k B_k(q_u[t], p[t])$$

where $$q_u[t] = \begin{bmatrix} u[t+l-1] \\ u[t+l-2] \\ \vdots \\ u[t+l-\tau] \end{bmatrix}$$

is the stack of recent (around t) baseband input samples. As noted above, the vector $p[t]$ is d-dimensional real vector of operating conditions at time t, $x_k$ (k=1, . . . , n) are the elements of a complex n-dimensional vector $x \in C^n$ (the coefficients of the compensator), and $B_k(q,p)$ are carefully selected "basis functions" of $\tau$-dimensional complex vector q and d-dimensional real vector p (a "careful" selection means that the operation of computing a single sample $v[t]$ of the corrected signal takes significantly less than n scalar multiplications; examples of carefully selected basis functions are provided in PCT Application No. PCT/US2019/031714, filed on May 10, 2019, titled "Digital Compensation for a Non-Linear System"). Two example operating conditions (i.e., in a situations where d=2) that may be used to form the expanded set of basis functions may include the drain voltage ($V_{DD}$) associated with the at least one power amplifier of the wireless device, and the temperature, in which case the vector $p[t]$ may be represented as follows:

$$p[t] = \begin{bmatrix} p_1[t] \\ p_2[t] \end{bmatrix} = \begin{bmatrix} V_{DD}[t] \\ Temp[t] \end{bmatrix}$$

In some examples, the formation of the adapted, spinoff, set of basis functions (comprising $b \cdot (d+1)$ basis functions, where b is the total number of terms in the initial/base set of basis functions, and d is the number of operating conditions that are used to generate the expanded, spinoff, set of basis functions) is achieved by forming one group of basis functions (comprising b terms) as the unmodified initial ("base") set of basis functions, and forming d additional groups of basis functions (each with b basis function terms) as the product of the respective measured operating conditions and the initial/base set of basis functions. Thus, an expanded set of adaptive basis functions, $B_k(q_u[t], p[t])$, for a situation involving use of two (2) operating conditions (e.g., $p_1$ and $p_2$, corresponding to $V_{DD}$ and temperature) can be represented as:

$$B_{3(k-1)+1}(q) = B_{k0}(q)$$

$$B_{3(k-1)+2}(q) = B_{k0}(q) \cdot p_1$$

$$B_{3(k-1)+3}(q) = B_{k0}(q) \cdot p_2$$

Other ways to generate an expanded set of basis functions, e.g., using other formulations and transformations to express as functions (linear or non-linear) of the operating conditions ($p_1, p_2, \ldots, p_n$), with such formulations and transformations being applied to the initial/base set of basis functions, may be used instead of or in addition to the above formulation involving the product of the operating conditions of $p_1$ and $p_2$ with the base set of basis functions. Furthermore, some groups of expanded basis function may be formed as a function of multiple operating conditions (e.g., each group of the expanded set may be expanded as a function/transformation involving combinations of $p_1, p_2, p_n$). It is to be noted that expansion of basis functions works best when there is some linear dependency between the operating conditions (e.g., $p_1$ and $p_2$, in the above example).

In operation, a compensator, such as the compensator C 110, operating according to an inverse model of the nonlinear distortion of the transmit chain (e.g., realized by the block F 120 of FIG. 1), and using adaptive basis functions (expanded and adapted according to contemporaneous operating condition values) that are weighed by regularly updated DPD coefficients, receives the input signal, u, and generates the intermediate input signal, v as follows:

$$v = 2u + \sum_{i=1}^{n} x_i f_i(u)$$

where $f_i(\bullet)$ is the $i^{th}$ basis function of the basis functions, and $x_i$ is the $i^{th}$ parameter (e.g., the $i^{th}$ weight) corresponding to the $i^{th}$ basis function. Each of the basis functions (at least in the base set) is a linear function (e.g., $u(t-1)$) or a non-linear function (e.g., $|u(t)|^2$) of the input, u, which may include memory (e.g., $u(t)*u(t-1)$).

In some implementations, the adaptation process implemented by the system 100 of FIG. 1 adjusts the coefficients set of coefficients, $x_k$ (where k represents a time instance or interval during which that set $x_k$ is being used) of the predistorter by observing the measurement samples y[t] and trying to minimize the regularized mean square error according to:

$$E(x) = \frac{\rho}{N}|x|^2 + \frac{1}{N}\sum_{t \in T}\left|e[t] - \sum_{k=1}^{n} x_k B_k(q_y[t], p[t])\right|^2,$$

where $$q_y[t] = \begin{bmatrix} y[t+l-1] \\ y[t+l-2] \\ \vdots \\ y[t+l-\tau] \end{bmatrix},$$

In the above expression, $e[t]=v[t]-y[t]$ is the input/output mismatch in the observed data, $\rho>0$ is the regularization factor (used to prevent poor conditioning of the optimization problem, which tends to result in unstable interaction between the adaptation process and the compensator application, as well as unreasonably large entries of the optimal $x+=\text{argmin } E(x))$, $T=\{t\}$ is a set of time samples, and N is the number of elements in T.

When n is small (e.g., n<<100), minimization of $E(x)$ can be carried out by computing the following correlation matrices:

$$G = \frac{1}{N}\sum_{t \in T} B[t]B[t]', \quad L = \frac{1}{N}\sum_{t \in T}(v[t] - y[t])'B[t],$$

where B[t] is a vector of the basis functions (i.e., a vector of complex entries, with one entry per basis function of n basis functions:

$$B[t] = \begin{bmatrix} B_1(q_y[t], p[t]) \\ \vdots \\ B_n(q_y[t], p[t]) \end{bmatrix}$$

In some example, the DPD coefficients to weigh the basis functions can then be computed according to the following expression, which includes a term dependent on $\rho$ to regularize the optimization:

$$\tilde{x} = \left(\left(\frac{p}{n}\right)I + G\right)^{-1} L$$

Alternatively, in some embodiments (e.g., when n is large), the DPD coefficients to weigh the adaptive basis functions can be computed according to a stochastic gradient process. An example stochastic gradient process that can be used is as follows.

The function $E(x)$ to be minimized can be expressed in the form:

$$E(x) = \rho|x|^2 + \frac{1}{N}\sum_{t \in T}|e[t] - a[t]x[t]|^2 = R + 2\text{Re}[L'x] + x'Gx + \rho|x|^2,$$

where $a[t]=[B_1(q_y[t],p[t]), B_2(q_y[t],p[t]), \ldots, B_n(q_y[t],p[t])]$ are the complex 1-by-n matrices formed by the basis function samples, and $$G = \frac{1}{N}\sum a[t]'a[t], \quad L = \frac{1}{N}\sum a[t]'e[t], \quad R = \frac{1}{N}\sum |e[t]|^2$$

are the components of the Gramian matrix computed from the data.

As time progresses, the data represented by the samples $(q_y[t], p[t], e[t])$, $t \in T$, gets refreshed with the outcomes of new measurements. In some situations, this can be done by either re-computing the Gramian, by averaging new and old Gramians, or by replacing the old $(q_y[t], p[t], e[t])$ samples with the new ones.

In some example implementations, the adaptation process used for a DPD implementation attempts to find the vector x of compensator coefficients as an approximation of the optimal $x_*=\text{argmin } E(x)$. An approach to finding $x_*=\text{argmin } E(x)$ is by computing it as the (unique) solution $x_*=(\rho I_n + G)^{-1}L$ of the linear equation $(\rho I_n + G)x=L$, where $I_n$ denotes the n-by-n identity matrix. This approach requires computation (and storage) of the n-by-n Hermitian matrix G, which makes it impractical even for very simple compensators (for example, a compensator with n=100 complex coefficients will require computing and storing $n^2=10000$ real coefficients of G). In addition, solving large systems of linear equations on FPGA or ASIC is a challenge on its own, and does not resolve the challenge of large storage required for Gramians.

Alternatively, the gradient of $E=E(x)$ at a point $x \in C^n$ is given by:

$$\nabla E(x) = 2(\rho x + Gx - L) = 2\left[\rho x + \frac{1}{N}\sum_{t \in T} a[t]'(a[t]x - e[t])\right],$$

and can be computed and stored as an n-by-1 complex matrix, which reduces the storage requirements, compared to those of the Gramian.

Once computed, the gradient can be used to adjust the current guess $\tilde{x}$ at the optimal x, according to $\tilde{x}^+ = \tilde{x} - \gamma \nabla E(\tilde{x})$, making it slightly better (as long as the step size parameter $\gamma$ is sufficiently small). With the updated guess $\tilde{x}=\tilde{x}^+$, the gradient can be re-computed, and another adjustment can be made. Repeating the process sufficiently many times leads to an arbitrarily accurate approximation $\tilde{x}$ of $x_*$. Thus, in approaches based on a gradient of the error function $E(x)$, a new/subsequent set of coefficients to weigh the basis functions applied by the compensator (e.g., the compensator C 110) can be estimated/approximated as a change of the current coefficients by a pre-determined multiple (i.e., a step-size $\gamma$) of the value of the gradient of $E(x)$.

Re-computing the gradient requires a significant number of operations each time. Since the number of steps of gradient search, before it reaches a satisfactory level of optimality, tends to be significant, compensator adaptation based on gradient search may be slow. Accordingly, in some embodiments, to reduce the amount of computation required to derive a current value of the gradient of $E(x)$ (based on which updated coefficients are to be computed), a sub-gradient approach to minimize $E(x)$ may be used to approximate the DPD coefficients x. Particularly, a stochastic gradient approach to minimize the function $E=E(x)$ is implemented based on the fact that the gradient $\nabla E(x)$ is the expected value of the vector random variable $$\xi = 2[\rho x + a[\tau]'(a[\tau]x - e[\tau])],$$

where $\tau$ is the random variable uniformly distributed on the finite set $T=\{t\}$, and that random samples of $\xi$ (which are much cheaper, from a computational effort, to compute than the true gradient $\nabla E(x)$) can replace $\nabla E(x)$ in the gradient search iterations without a significant loss of convergence rate. In the above expression, $a[\tau]$ represents a matrix of values resulting from application of the basis functions, as weighed by the DPD coefficients x, to the input sample(s) at a randomly selected instant corresponding to the random variable $\tau$, and $e[\tau]$ is the input/output mismatch in the observed data between an output of an observer receiver and the output of the digital compensator (e.g., the output y of the sensing section S 130, and the output v of the compensator C 110).

Thus, a stochastic gradient approach that may be used includes constructing a sequence of random values $\tilde{x}_0$, $\tilde{x}_1$ . . . (taking values in $C^n$), and updating the current coefficients at an instance k (namely, $\tilde{x}_k$) as follows:

$$\tilde{x}_{k+1} = \tilde{x}_k + \alpha a[\tau_k]'(e[\tau_k] - a[\tau_k]\tilde{x}_k) - \alpha \rho \tilde{x}_k, \tilde{x}_0 = 0,$$

where $\tau_1, \tau_2, \ldots, \tau_n$ are independent random variables uniformly distributed on $T=\{t\}$, $\rho>0$ is the regularization constant from the definition of $E=E(x)$, and $\alpha>0$ is a multiple (which may be a constant value that can be adjusted at regular or irregular periods) such that $\alpha(\rho + |a[t]|^2) < 2$ for every $t \in T$. The value $\alpha$ represents the step size that is applied to a value based on the expected value of the vector random variable used to approximate the gradient $\nabla E(x)$.

The expected value $\bar{x}_k = E[\tilde{x}_k]$ can be shown to converge to $x_* = \text{argmin } E(x)$ as $k \to \infty$. An averaging operation may be used according to the expression:

$$\tilde{y}_{k+1} = \tilde{y}_k + \epsilon(\tilde{x}_k - \tilde{y}_k), \text{ with } \epsilon \in (0,1].$$

The difference between $\tilde{y}_k$ and $x_*$ is small for large k, as long as $\epsilon > 0$ is small enough. This approach to minimizing $E(x)$ is referred to as a "projection" method, since the map $$x \to x + |a[t]|^{-2}a[t]'(e[t] - a[t]x[t])$$

projects x onto the hyperplane $a[t]x = e[t]$.

In practical implementations of the processes to compute approximation of the gradient of $E(x)$, and to thus update the current coefficients, $\tau_k$ are generated as a pseudo-random sequence of samples, and the calculations of $\tilde{y}_k$ can be eliminated (which formally corresponds to $\epsilon=1$, i.e., $\tilde{y}_k = \tilde{x}_{k-1}$). As a rule, this requires using a value of $\alpha$ with smaller minimal upper bound for $\alpha(\rho + |a[t]|^2)$ (for example, $\alpha(\rho + |a[t]|^2) < 1$, or $\alpha(\rho + |a[t]|^2) < 0.5$). In some embodiments, the values of $\alpha$ is sometime adjusted, depending on the progress made by the stochastic gradient optimization process, where the progress is measured by comparing the average values of $|e[\tau_k]|$ and $|e[\tau_k] - a[\tau_k]\tilde{x}_k|$. In some embodiments, a regular update of the set of the optimization problem parameters $a[t]$, $e[t]$ may be performed to replace the data samples $a[t]$, $e[t]$ observed in the past with new observations.

Because, in the stochastic gradient approach described herein, the DPD coefficients are dynamically updated (reflecting the fact that the behavior of the system 100 changes over time), the expected values for the vector random value $\xi$ represents a good approximation or estimate for the gradient $\nabla E(x)$, thus allowing for cheaper computation (from a computational effort perspective) of the values used to update the DPD coefficient x used by the compensator of the system 100.

In some embodiments, the value of the step size (that multiplies the approximation determined for the gradient $\nabla E(x)$) may be adjusted based on a measure of progress of the stochastic gradient process, with the measure of progress being determined by, for example, comparing an average values of $|e[\tau_k]|$ and $|e[\tau_k] - a[\tau_k]\tilde{x}_k|$. In some examples, the process starts off with a relatively larger step size and then gradually reduces the step size.

Figure 5:
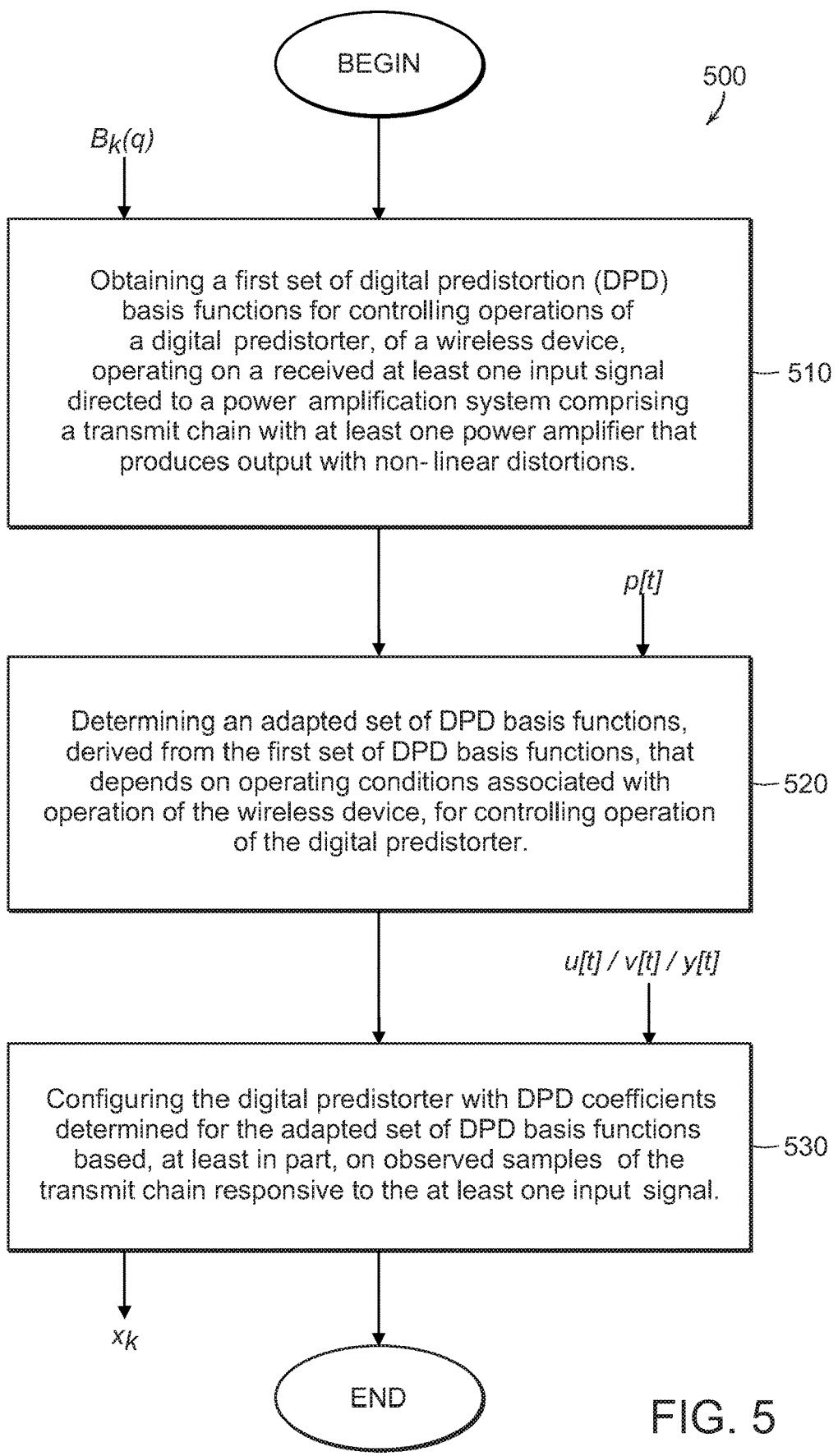
FIG. 5 is a flowchart of an example procedure for digital predistortion using adaptive basis functions.

With reference next to FIG. 5, a flowchart of an example procedure 500 for digital predistortion, based on the use of adaptive basis functions (e.g., formed using operating conditions of a digital predistortion system performing the procedure 500) is shown. The procedure 500 includes obtaining 510 a first set of digital predistortion (DPD) basis functions (shown as the base basis function $B_k(q)$, which is expressed as a function of the samples of the input signal u, namely, $q_u[t]=(u[t+l-1], u[t+l-2], \ldots, u[t+l-\tau]))$ for controlling operations of a digital predistorter, of a wireless device, operating on a received at least one input signal. The at least one input signal is directed to a power amplification system (such as the system 100 of FIG. 1) comprising a transmit chain (such as the transmission section F 120 of FIG. 1) with at least one power amplifier that produces output with non-linear distortions.

With continued reference to FIG. 5, the procedure 500 additionally includes determining 520 an adapted set of DPD basis functions, derived from the first set of DPD basis functions, that depends on operating conditions (shown as being provided through the data p[t] received at the block 520) associated with operation of the wireless device, for controlling operation of the digital predistorter. In some examples, the operating conditions may include one or more of, for example, channel information associated with a corresponding channel used by the wireless device to process the at least one input signal, a corresponding temperature, a corresponding average power, a corresponding drain voltage ($V_{DD}$) associated with the at least one power amplifier of the wireless device, a corresponding Voltage Standing Wave Ratio (VSWR) associated with the wireless device, and/or age of collected samples used for determining the DPD coefficients.

As discussed herein, the adaptive set of basis function if formed through transforming an original set of carefully selected basis functions that includes complex terms that depend on a τ-dimensional complex vector q (corresponding to complex input samples to the digital distorter) to an expanded set of functions through transformations that are implemented, for example, by real terms that depend on a d-dimensional real vector p representative of values of the operating conditions (including environmental characteristics) associated with the operation of the wireless device on the received at least one input signal. The value d is representative of a number of parameters of the operating conditions, associated with the operation of the wireless device, that are being used to expand the base set of the basis functions. In such embodiments, a total number of basis functions (in the expanded set) used to digitally predistort the at least one input signal is proportional to the product of a number of terms, b, in the first set of basis functions, and d+1, such that the total number of basis functions is proportional to b·(d+1). The basis functions thus comprise (d+1) groups of basis functions, with a first group of basis functions including, in some examples, the first set of basis functions without any modification, and with each of the remaining d groups of basis functions determined as the product of the first set of basis functions and one of the operating conditions (e.g., environmental characteristics) associated with the wireless device. In some other examples, other types of transformations, expressed as linear or non-linear functions of the operating conditions, may be used to expand the base set of basis functions.

With continued reference to FIG. 5, the procedure 500 also includes configuring the digital predistorter with DPD coefficients (illustrated as the output $x_k$ of the block 530) determined for the adapted set of DPD basis functions based, at least in part, on observed samples (e.g., y[t] in FIG. 1, and as illustrated as an input to the block 530, and/or the input signal u[t] or the output v[t] of the compensator C 110 of FIG. 1) of the transmit chain responsive to the at least one input signal.

In some embodiments, configuring the predistorter with the DPD coefficients may include computing the DPD coefficients according to an optimization process that yields the DPD coefficients, $x_k$, as weights to the basis functions that minimizes an error function based on the observed samples of the transmit chain and samples of the at least one input signal. In such embodiments, computing, according to the optimization process, the DPD coefficients, $x_k$, may include adaptively adjusting the DPD coefficients, $x_k$, through minimization of a regularized mean square error function $E(x)$ according to:

$$E(x) = \frac{\rho}{n}|x|^2 + \frac{1}{N}\sum_{t \in T}\left|v[t] - y[t] - \sum_{k=1}^{n} x_k B_k(q_y[t], p[t])\right|^2,$$

$$\text{where } q_y[t] = \begin{bmatrix} y[t+l-1] \\ \vdots \\ y[t+l-\tau] \end{bmatrix}$$

where $\rho>0$ is a regularization factor, $B_k$ are the basis functions for k=1 to n, $q_y[t]$ are stacks of input samples at time t, p[t] are d-dimensional real vectors of the operating conditions (which may include environmental characteristics) at the time t, v[t] is an output of a digital predistortion (DPD) compensator at the time t, and y[t] is the output of an observation receiver coupled to an output of the transmit chain.

As described herein, adaptively adjusting the DPD coefficients, $x_k$, may include deriving correlation matrices G and L, when n<<100, with n being representative of the number of basis functions, according to:

$$G = \frac{1}{N}\sum_{t \in T} B[t]B[t]', \quad L = \frac{1}{N}\sum_{t \in T}(v[t]-y[t])'B[t],$$

$$\text{where } B[t] = \begin{bmatrix} B_1(q_y[t], p[t]) \\ \vdots \\ B_1(q_y[t], p[t]) \end{bmatrix},$$

and deriving the DPD coefficients, $x_k$, according to $$\bar{x} = \left(\left(\frac{\rho}{n}\right)I + G\right)^{-1} L.$$

Alternatively, adaptively adjusting the DPD coefficients, $x_k$, may include approximating the DPD coefficients, $x_k$, according to a stochastic gradient process.

Third Technique: Variety-Based Adaptation Approach

As discussed herein, another technique/approach to achieve agile estimation of predistortion parameters, based on sparse data acquisition/availability, and/or to counter rapidly changing operating conditions, is through the implementation of a variety matrix that is used to maintain a limited number of sample points based on which adaptation processes are performed. To facilitate robust digital predistortion performance, the variety matrix techniques described herein use optimization data that includes input/output samples collected from a diverse set of operating conditions.

The diversity (i.e., variety) of the data used to perform the optimization process (e.g., using one or more of the optimization processes described herein) is achieved using a diversity matrix that allows the collection of data samples that provide a greater diversity of the data set, and preserves historical data samples that have high relevance and usability for updating the DPD coefficient (samples' relevance can decrease over time, as the previously collected samples age).

Briefly, under the variety matrix approach, a DPD system, such as the system 100 depicted in FIG. 1, collects data (e.g., maintained in a memory storage device coupled to the adaptation section A 140, or to any other of the subsystems of FIG. 1) that includes data records, with each data record including input signal data and corresponding output signal data for the transmit chain (e.g., implemented via the transmission section F 120). The records may be maintained in a matrix-like data structure, and each may be associated with a set of operating conditions values (e.g., temperature, the power supply voltage associated with the power amplifier of the transmission section, load conditions, band attributes associated with the spectral band through which the data was collected or is to be transmitted to, a VSWR value, sampling rate, modulation mode, age of the samples, etc.), which may also be stored within the matrix. Each data record may be associated with a variety measure/score that is representative of an extent of distinguishability of the respective data record from other collected data records. Such a measure may be stored as a field or entry of the data records (e.g., within the matrix storing others portions of the collected data), or may be stored as a separate data structure, with the positions of different measures within the data structure corresponding to the particular records with which the different measures are respectively associated.

To manage the computational complexity involved with the optimization process used to compute adaptive DPD coefficients (that weigh the basis functions, such as the adaptive basis functions described herein), a subset of collected samples may need to be selected. This selection may be required in situations where the method of optimization is one based on use of correlation matrices (which, as was noted above, is computationally manageable when the number of data samples used in the optimization process is relatively small, e.g., n<<1000). Thus, in the variety-based approach discussed herein, the subset of records used for optimization is selected according to the variety measures associated with the data records. For example, in embodiments in which the variety measures are associated with the extent/degree of distinguishability of records from each other, the selection of the records to be used in the optimization can be one where the k records (from the available n records, where k<n) that provide the most distinguishability (i.e., the most diversity or variety) are selected. In some implementations, the selection of records is performed dynamically, concomitantly with receipt of data, by deciding whether to replace an existing record within a matrix structure, associated with a particular variety measure/score, with a newly arrived record whose variety measure indicates a higher degree of distinguishability than the existing record. In that situation, the previously stored record is replaced in favor of the new record. Further details about the procedure to replace records (to thus maintain records that increase or promote the extent of record diversity) are provided below.

Computation of the variety measure (which may be performed by the adaptation section A 140) may include computing, for the each data record, the variety measure based on distance metric representative of distances between data elements for a particular signal instance (e.g., the values representative of the samples and/or the values representative of operating conditions for the data record for the signal instance), and respective data elements of records (stored in the matrix) for other signal instances. The distance may be computed according to one or more formulation used for determining distances in a mathematical hyperspace of dimension n. Other processes for computing a variety measure/score may also be used. The computed variety measures can then be ranked, and, in implementations in which only a certain number (k) of the available signal instances are used for deriving the DPD coefficients, the k records with the highest variety measures/scores may be selected for use in the optimization process. Other criteria for selecting the k records, according to the variety measures associated with the data records may be used.

As noted, the collected data records, comprising input and output samples, and corresponding operating conditions, can be arranged in a matrix data structure, also referred to as a variety database V, as follows:

$$V = \begin{bmatrix} q_1 & q_2 & \dots & q_m \\ p_1 & p_2 & \dots & p_m \\ e_1 & e_2 & \dots & e_m \end{bmatrix}$$

where $q_i = q_y[t_i]$ is a complex vector of input samples collected for a signal i (in some examples, 5, 10, or any number of samples may be collected for every signal instance i), $p_i = p[t_i]$ is the corresponding vector of operating conditions associated with the record corresponding to the signal instance i, and $e_i = v[t_i] - y[t_i]$ is the difference between the resultant predistorted output of the compensator (such as the compensator C 110 of FIG. 1) and the observed output sample of the transmit chain (the $e_i$ values are used for the optimization process to compute the adaptive DPD coefficients to weight the basis functions applied to input signals u[t] provided to the input of the compensator). The variety matrix V can be of any size, but in some typical examples the number of columns, m, is less than a 1000, which allows the optimization process for the adaptation procedure to be performed, for example, through the correlation matrices techniques described herein. As noted, if the number of distinct sample records in the database (distinct i) is relatively large, the computations complexity for optimizing the DPD coefficients using the correlation matrices technique may be too high, and, under such circumstances, a stochastic gradient process may be employed. The following V matrix example stored for each signal instance 3 samples, and two operating condition parameters (e.g., VDD and temperature), resulting in a matrix defining a 5-dimensional space.

$$V = \begin{bmatrix} u_1[t+1] & u_2[t+1] & \dots & u_m[t+1] \\ u_1[t+0] & u_2[t+0] & \dots & u_m[t+0] \\ u_1[t-1] & u_2[t-1] & \dots & u_m[t-1] \\ p_1(1) & p_2(1) & \dots & p_m(1) \\ p_1(2) & p_2(2) & \dots & p_m(2) \\ \dots & \dots & \dots & \dots \end{bmatrix}$$

Generally, however, each signal instance (stored in each of the columns of the V matrix) will include more than three (3) signal sample points in order to improve the accuracy and robustness of the optimization process to derive the DPD coefficients, $x_k$.

In some embodiments, the matrix V may be accompanied by a minimal distance vector R, namely $R=[r_1, r_2, \ldots, r_m]$ which maintains variety measures (e.g., one measure for each of the columns/records of the variety matrix V) that can be computed as a distance function between various elements of a particular signal instance (e.g., a newly arrived signal instance), and any of the other columns/records of the variety matrix V. In such embodiments, the greater the distance between any two records, the greater the diversity score (i.e., the distinguishability) corresponding to the records used to optimize the DPD coefficients. In some embodiments, the minimal distance R vector entries may be combined with the V matrix (e.g., as an added row of the matrix V). Large variety measure values, as reflected by the vector R, may be indicative of a high degree of distinguishability between the corresponding columns (which correspond to the signal instances) and thus indicative of a good distribution of the samples over the possible space of operating conditions. Large variety can reduce sampling bias (or conversely increase the randomization of samples) that may have been caused if the sample instances collected are too closely lumped to each other (i.e., their corresponding operating condition are too closely lumped, which would result in a less robust predistorter).

As noted, in some embodiments, a matrix of a predetermined size (e.g., with k columns, and m rows, where each column represents a separate signal instance, and each row represents values associated with a signal instance, including the sample values and values representative of operating conditions) is initially populated with an initial data set (e.g., all '0's), and gradually, as new samples arrive, their distance (according to one or more distance formulation) to data entries stored in the V matrix are computed, and a determination of whether the newly arrived sample offers more diversity (relative to currently stored sampling instances) is made. If the newly arrived sample would cause a higher diversity of data maintained in the V matrix, that newly arrived data replaces one of the columns in the matrix V.

An example of a process to determine (according to one or more criteria that are based on computed variety measures) if existing data within the matrix V is to be replaced by data corresponding to a newly arrived data entry ($q_y[t]$, $p[t]$,$v[t]-y[t]$) is as follows:

1) Compute $h_i$=dist$_*$(($q_i$, $p_i$), ($q_y[t]$,$p[t]$)) for i=1, ..., m, where the approximate distance dist$_*$((q, p), ($\tilde{q}$, $\tilde{p}$)) denotes an easy-to-compute measure of distance between the pairs (q, p) and ($\tilde{q}$, $\tilde{p}$). In some embodiments, $h_i$ may be derived as a maximal absolute value of difference between the corresponding individual components of q, p, $\tilde{q}$, $\tilde{p}$ in a quantized grid.
2) Replace each entry $r_i$ of R with min$\{r_i, h_i\}$.
3) Find the index k $\epsilon\{1, 2, \ldots, m\}$ of a minimal entry $r_k$ in the updated R. In this operation, the replacement process identifies an entry from the updated R vector with the smallest minimal distance. This entry will correspond to a column whose relative distinguishability to other sample data points is low (i.e., it is associated with a low variety measure).
4) Replace the k-th column of V matrix with a new column, according to $q_k=q_y[t]$, $p_k=p[t]$, $e_k=v[t]-y[t]$.
5) Replace the k-th entry of R with $h_i$.

As noted, in some embodiments, one example of an operating condition parameter that may be used is the age of the existing data sample. In such embodiments, a relatively old existing sample data instance in the matrix V may result in a large distance value (i.e., a large h value) between that old existing sample data instance and the new data sample point. Thus, if the new data sample point replaces the old existing sample data instance in the matrix V, the corresponding entry in the R vector will have a relatively large h value, and consequently that just replaced column will be less likely to be replaced by the next sample data instance collected (i.e., because the corresponding entry is less likely to be the minimal entry in the R vector).

In some implementations, a decision may be made not to replace any of the existing columns with a new sampling data instance. For example, if it is determined that the computed variety measure for the new sampling data instance would result in a less diverse set of sample instances (e.g., because there is already a large group of sampling data points that are similar to the newly considered sampling data point), the replacement procedure may determine to retain all the existing records (e.g., matrix columns) and discard the newly collected sampling data instance.

Other approaches and techniques to control (e.g., replace) the content of the V matrix (by applying different variety criteria that are based on computed variety measures) may be implemented. Such approaches, including the above approach to replace columns of the V matrix, are configured to allow the most diverse data to be kept in the V matrix.

At regular or irregular time intervals, (e.g., every second, 10 seconds, 1 minute, 1 hour, etc.), an adaptation process such as the various processes discussed herein may be performed using the available sampling data points (including new sampling data points that have been added to the V matrix since the previous update). Alternatively, in some examples the adaptation process may be run after certain number of updates has been performed on the V matrix (e.g., after 50% of the columns of the V matrix have been replaced since the previously run adaptation process). As discussed herein, the adaptation process to determine DPD coefficients to weigh basis functions may performed by re-optimizing the DPD coefficients x according to:

$$E_V(x) = \frac{\rho}{n}|x|^2 + \frac{1}{m}\sum_{i=1}^{m}\left|e_i - \sum_{k=1}^{n} x_k B_k(q_i, p_i)\right|^2$$

where m is the i-th column of the database matrix (i.e., the V matrix), and $x_k$ (k=1, ..., n) are the elements of a complex n-dimensionalized vector of the compensator (which, when adapted using the approaches described herein, acts as a universal compensator), with $x \in \mathbb{C}^n$.

Figure 6A:
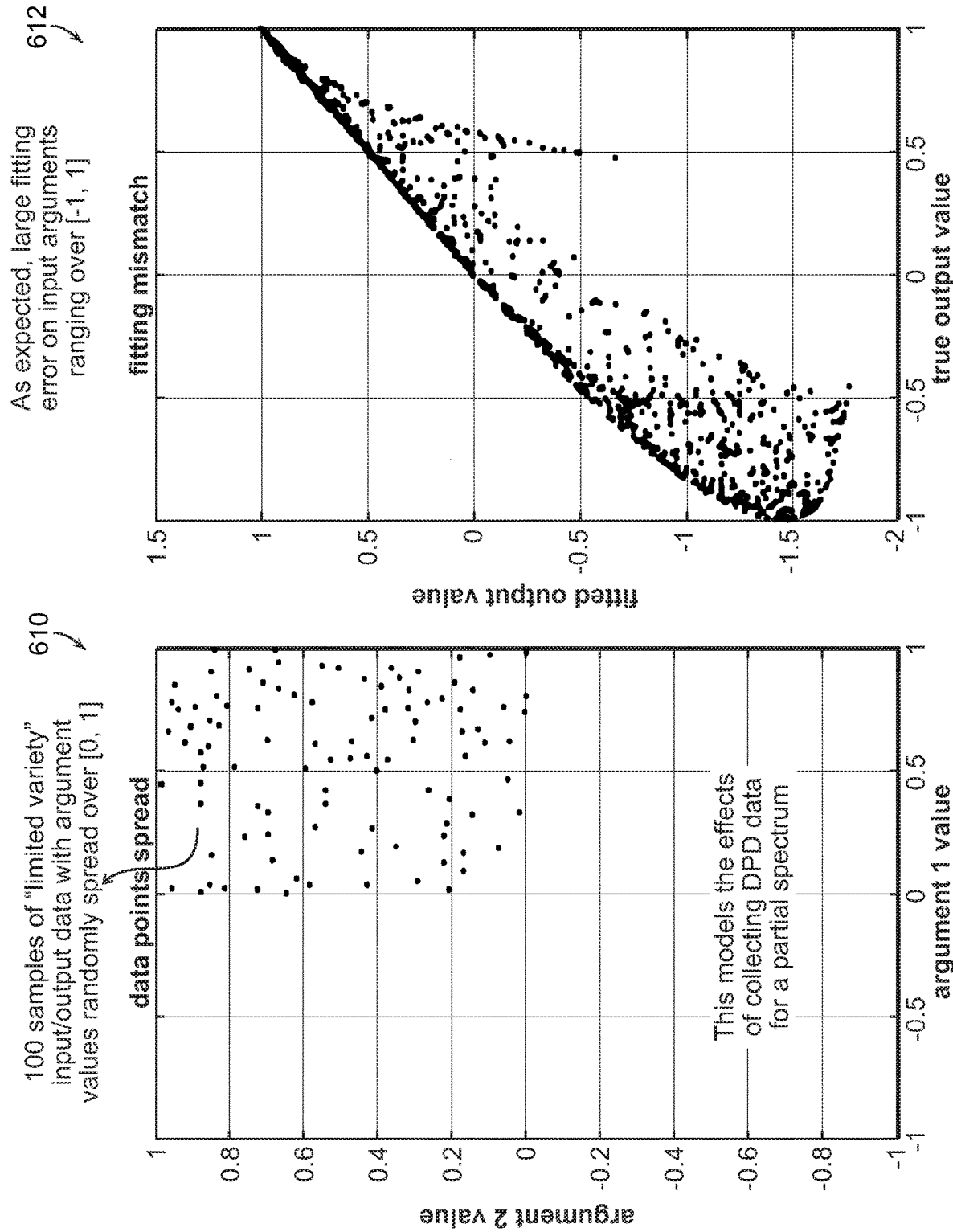
FIG. 6A includes graphs illustrating simulation results for an optimization process performed without ensuring a good variety of samples.

To illustrate the effect of using a variety-based approach to select well distributed sample data points to perform DPD coefficient optimization processing, consider FIG. 6A showing graphs 610 and 612 depicting the simulation results for an optimization process performed without ensuring a good variety of samples. In this simulation, 100 samples of limited variety input/output data with argument values randomly spread over [0, 1] were generated. The distribution of the samples is shown in graph 610 of FIG. 6A. An optimization process to fit polynomials of degree 3 was then performed. The graph 612 shows the fitting error (mismatch) resulting from the use of the limited variety sample points. As expected, large fitting error, ranging over the [−1, 1] resulted from the fitting procedure applied to the limited variety samples.

Figure 6B:
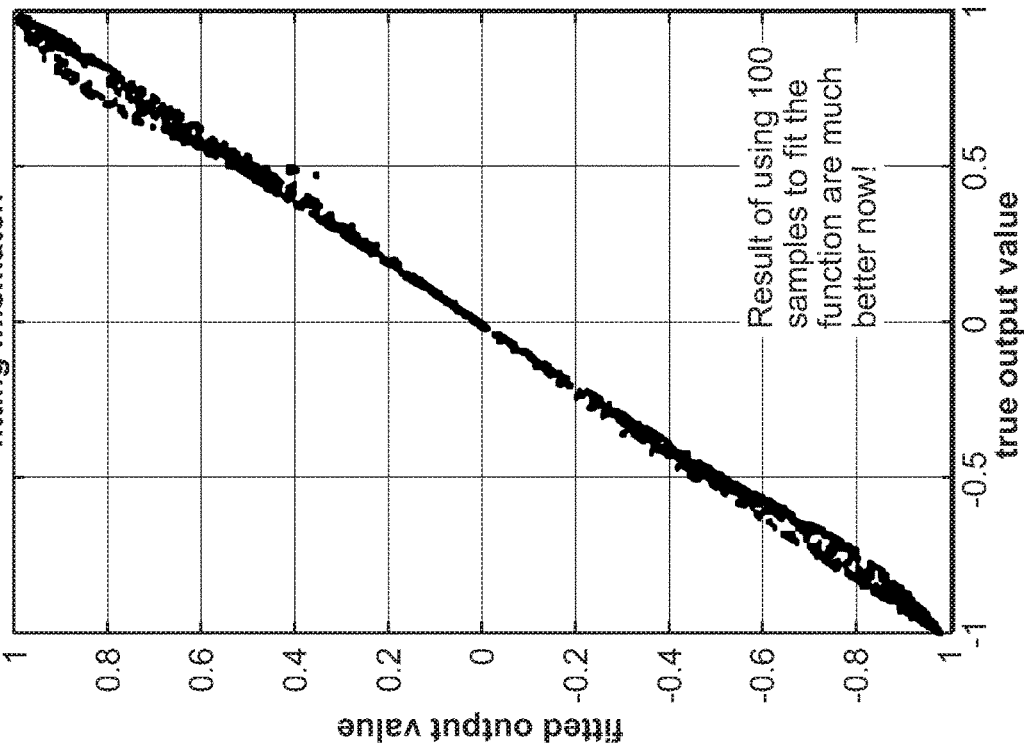
FIG. 6B includes graphs showing simulation results when the optimization process used samples that were subject to a variety-based distribution (randomization) approach to promote sample diversity.
Figure 6B:
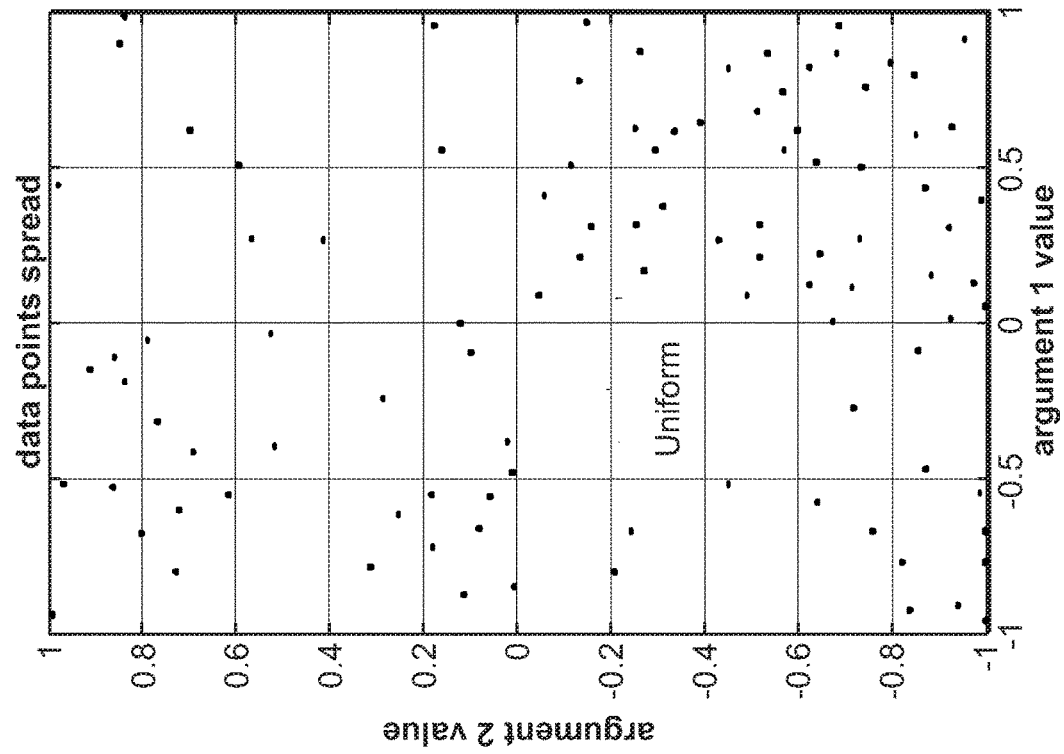

In contrast, FIG. 6B shows simulation results when the optimization process used samples that were subject to a variety-based distribution approach that promoted sample diversity. In this simulation, new data was continually used to update a variety database matrix with 100 records (i.e., 100 columns). The first 1000 samples (with x and y arguments) that were fed and processed by the sample selection and replacement process (based on an approach similar to that described above) had a range of x∈[−1, 0], y ∈[−1, 0], then 1000 samples with x∈[−1, 0], y ∈[0, 1] were processed, and finally, 1000 samples with x∈[0, 1], y ∈[−1, 0] were processed. As shown in graph 620 of FIG. 6B, the coverage process (i.e., sample selection/replacement process) maintains a reasonably uniform coverage (and thus has high diversity/variety level) over the whole range [−1, 1]. Consequently, and as shown in graph 622, the fitting mismatch resulting from performing an optimization process (similar to that applied in relation to the simulation of FIG. 6A) is much improved over the resultant fitting mismatch of the simulation results illustrated in FIG. 6A.

Figure 7:
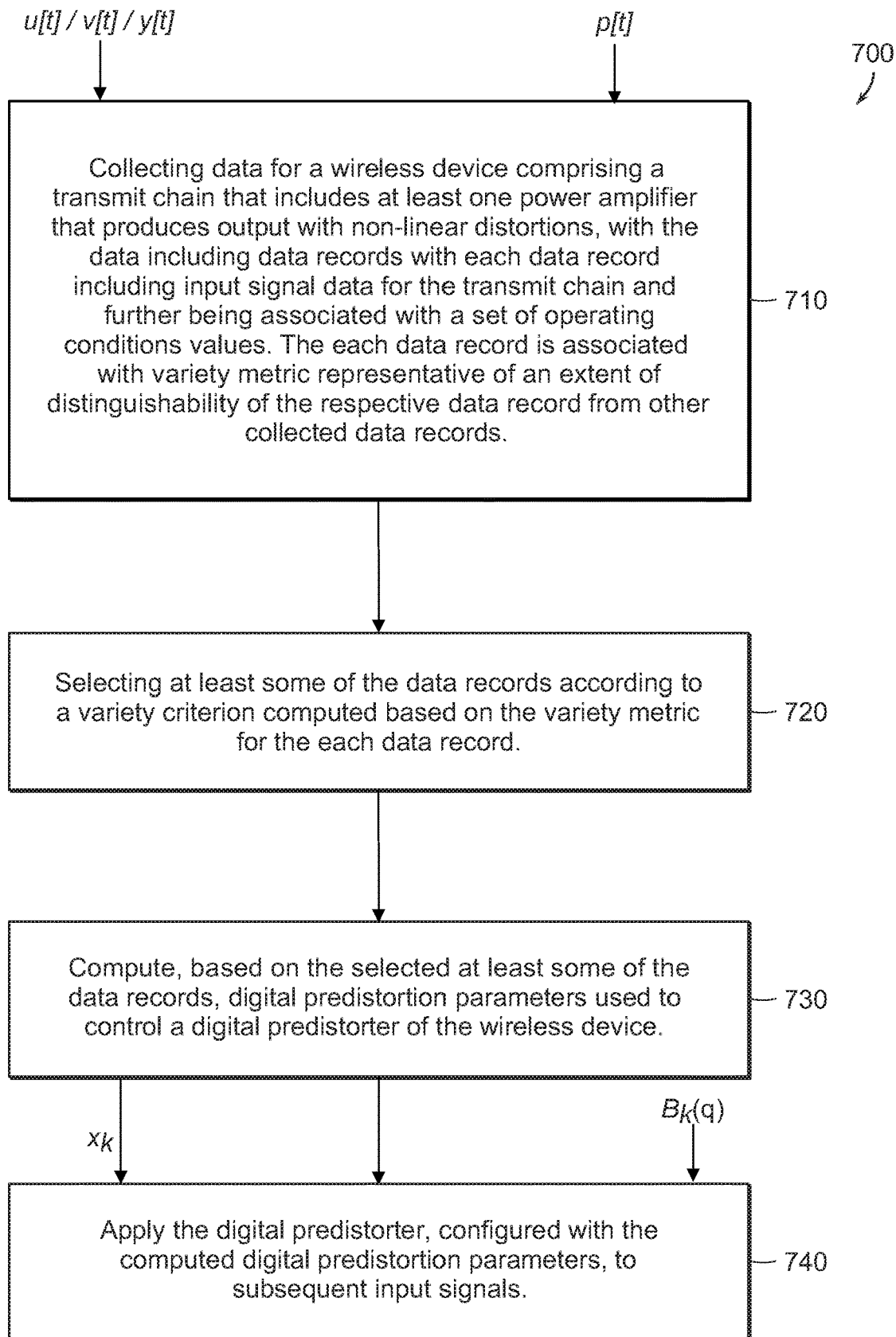
FIG. 7 is a flowchart of an example procedure for digital predistortion implemented using a DPD adaptation process based on a variety-based approach.

With reference next to FIG. 7, a flowchart of an example procedure 700 for digital predistortion (particularly, to perform DPD adaptation using a variety-based approach) is shown. The procedure 700 includes collecting 710 data for a wireless device comprising a transmit chain (e.g., similar to the transmission section F 120 depicted in FIG. 1) that includes at least one power amplifier that produces output with non-linear distortions, with the data including data records that each includes input signal data (e.g., the signal u[t]) and corresponding output signal data (v[t] and/or y[t] signals shown in FIG. 1) for the transmit chain, and further being associated with a set of operating conditions values (shown as the vector p[t] in FIGS. 1 and 7). The each data record is associated with a 7variety measure representative of an extent of distinguishability of the respective data record from other collected data records. Examples of the operating conditions for the each data record may include one or more of, for example, channel information associated with a corresponding channel used by the wireless device to process the respective data record, a corresponding temperature, a corresponding average power, a corresponding power supply voltage ($V_{DD}$) associated with the at least one power amplifier of the transmit chain, a corresponding Voltage Standing Wave Ratio (VSWR) associated with the wireless device, and/or age of the each data record.

As noted, in some implementations, the predistorter may be realized in accordance with the first technique approach discussed above. In that approach, adaptation of the predistorter may be implemented based on samples that are collected in narrow subbands, rather than samples collected under wideband conditions (e.g., in which the bandwidth of the device's wireless transceiver obtaining the data is substantially equal to the spectral range for which the predistorter is to be implemented). Thus, in such embodiments, collecting the data for the wireless device may include collecting the data in one or more spectral channels, the one or more spectral channels located within a wide band spectral range, with each of the one or more spectral channels having a respective bandwidth smaller than a range bandwidth of the spectral range.

In some examples, each of the data records may include one or more samples obtained by the wireless device under a particular set of operating conditions. The each of the data records may be maintained in a separate column of a records matrix data structure.

With continued reference to FIG. 7, the procedure 700 further includes selecting 720 at least some of the data records according to a variety criterion computed based on the variety measure for the each data record. Selecting the at least some of the data records according to the variety criterion computed based on the variety measure for the each data record may include selecting data records associated with respective variety measures indicative of high distinguishability in order to increase diversity of the data records used to compute the digital predistortion parameters.

The procedure 700 additionally includes computing 730, based on the selected at least some of the data records, digital predistortion parameters used to control a digital predistorter of the wireless device, and applying 740 the digital predistorter, configured with the computed digital predistortion parameters, to subsequent input signals. In some embodiments, applying the digital predistorter, configured with the digital predistortion parameters, may include weighing basis functions of the digital predistorter, with the basis functions including (in embodiments such as those discussed in relation to the adaptive, expanded, basis functions that are formed from a base set of basis functions) complex terms applied to values of input samples provided in the data records, and with at least some of the basis functions further comprising real terms applied to values of sets of operating conditions associated with the data records.

In some implementations, the procedure 700 may also include computing, for the each data record, the variety measure based on distance metric representative of distances between data elements of a particular data record, to respective data elements for at least some of the collected data records. The computed variety measure for the each data record may be maintained in a distance vector data structure (such as the R vector discussed above) separate from a data structure to store the collected data records.

As discussed, under the variety approach, data samples used for the adaptation procedure are occasionally replaced with new sample data records that may be more relevant in that they promote diversity of the samples used in the adaptation process (in part because they are newer). Examples of a replacement procedure for data records includes occasionally collecting additional data records, storing a particular one of the collected additional data records in a records data structure in response to a determination that a variety measure computed for the particular one of the collected additional data records is more distinguishable, relative to previously stored data records available at the records data structure, than one of the previously stored data records, and re-computing, at regular or irregular intervals, the digital predistortion parameters based on the stored data samples available in the records data structure, including the stored particular one of the collected additional data records. In such embodiments, storing the particular one of the collected additional data records may include replacing in the records data structures the one of the previously stored data records with the particular one of the collected additional data records. The procedure may also include computing a corresponding variety measure for the particular one of the collected additional data records, including determining for each pair of records comprising the particular one of the collected additional data records and at least one of the previously stored data records a maximal absolute value of difference between the corresponding elements of the data records.

The approaches described above may be used in conjunction with the techniques described in PCT Application No. PCT/US2019/031714, filed on May 10, 2019, titled "Digital Compensation for a Non-Linear System," which is incorporated herein by reference. For instance, the techniques described in that application may be used to implement the actuator (referred to as the pre-distorter in the incorporated application), and to adapt its parameters, and in particular to form the actuator to be responsive to an envelope signal or other signal related to power control of a power amplifier.

In some implementations, a computer accessible non-transitory storage medium includes a database (also referred to a "design structure" or "integrated circuit definition dataset") representative of a system including, in part, some or all of the components of a digital predistortion, and/or DPD adaptation implementations and processes described herein. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for digital predistortion of signals provided to a radio frequency (RF) transmission path configured to transmit radio signals in a plurality of subbands within a spectral range, the method comprising:
    configuring a digital predistorter for predistorting signals comprising arbitrary spectral content within the spectral range, the configuring including:
        acquiring data samples representing operation of the RF transmission path to transmit radio signals in different subbands, each data sample including a digital input signal provided to the RF transmission path for transmission and a digital sensed signal representing a sensing of a radio transmission in response to the provided digital signal, the each digital input signal representing spectral content concentrated in a respective single corresponding subband within the spectral range, and
        updating parameters of the digital predistorter according to the acquired data samples to mitigate non-linear characteristics of the RF transmission path;
    receiving a further input signal for transmission by the RF transmission path, the further input signal representing spectral content in a particular subband within the spectral range; and
    using the configured predistorter to process the further input signal to yield a predistorted signal for providing to the RF transmission path.

2. The method of claim 1, wherein the spectral range, W, comprises n RF bands of approximately equal-sized bandwidths.

3. The method of claim 1, wherein acquiring the one or more data samples comprises:
    controllably adjusting a wireless device comprising the RF transmission path to operate in one or more of the different subbands within the spectral range; and
    at each of the one or more of the different subbands, measuring at least one set of samples.

4. The method of claim 1, wherein acquiring the data samples comprises:
    measuring during runtime, subsequent to an initial computation of the parameters of the digital predistorter, additional sets of samples at additional subbands within the spectral range; and
    re-updating the parameters of the digital predistorter further based on at least some of the additional sets of samples.

5. The method of claim 1, wherein the digital predistorter is implemented in a user equipment (UE), and wherein the plurality of subbands are successively assigned bands for transmission.

6. The method of claim 1, wherein the updated parameters of the digital predistorter are configured to weigh non-linear functions used to predistort the further input signal, wherein the non-linear functions include complex terms that depend on a τ-dimensional complex vector q corresponding to complex input samples to the digital distorter, and real terms that depend on a d-dimensional real vector p representative of values of operating condition parameters associated with operation of the RF transmission path, wherein d is representative of a number of the operating condition parameters associated with the operation of the RF transmission path.

7. The method of claim 6, wherein a total number of the non-linear functions used to digitally predistort input signals is proportional to the product of a number of terms, b, in a first set of non-linear functions, and d+1, such that the total number of non-linear functions is proportional to b·(d+1).

8. The method of claim 1, wherein acquiring the data samples representing the operation of the RF transmission path in the different subbands further comprises:
collecting for the one or more data samples corresponding operating condition parameters, wherein the corresponding operating condition parameters comprise one or more of: a corresponding temperature of the RF transmission path, a corresponding average power, a corresponding power supply voltage ($V_{DD}$) associated with at least one power amplifier of the RF transmission path, a corresponding Voltage Standing Wave Ratio (VSWR) associated with the RF transmission path, age of the collected each of the sets of samples, or corresponding channel information in which the data samples are collected.

9. The method of claim 1, wherein using the configured predistorter to process the further input signal comprises:
predistorting the further input signal according to:

$$v[t] = u[t] + \sum_{k=1}^{n} x_k B_k(q_u[t], p[t]),$$

$$\text{where } q_u[t] = \begin{Bmatrix} u[t+l-1] \\ \vdots \\ u[t+l-\tau] \end{Bmatrix}$$

where v[t] is an output of the digital predistorter at time t, u[t] is an input sample to the digital predistorter at the time t, $B_k$ are the non-linear functions for k=1 to n, $q_u[t]$ are stacks of input samples, p[t] are d-dimensional real vectors of operating condition parameters at the time t, and $x_k$ are the computed digital predistortion parameters to weigh the non-linear functions.

10. The method of claim 9, wherein updating the parameters of the digital predistorter comprises:
deriving, according to an optimization process that is based, at least in part, on the acquired data samples measured in the different subbands, the digital predistortion parameters, $x_k$, to weigh the non-linear functions $B_k$.

11. The method of claim 10, wherein deriving according to the optimization process the parameters, $x_k$, of the digital predistorter comprises:
adaptively adjusting the digital predistortion parameters, $x_k$, through minimization of a regularized mean square error function E(x) according to:

$$E(x) = \frac{\rho}{n}|x|^2 + \frac{1}{N}\sum_{t \in T}\left|v[t] - y[t] - \sum_{k=1}^{n} x_k B_k(q_u[t], p[t])\right|^2,$$

where ρ>0 is a regularization factor, v[t] is an output of the digital predistorter at the time t, and y[t] is the output of an observation receiver coupled to an output of the RF transmission path.

12. The method of claim 11, wherein adaptively adjusting the digital predistortion parameters, $x_k$, comprises:

deriving correlation matrices G and L, when n<<100, with n being representative of the number of non-linear functions, according to:

$$G = \frac{1}{N}\sum_{t \in T} B[t]B[t]', \quad L = \frac{1}{N}\sum_{t \in T}(v[t] - y[t]')B[t],$$

$$\text{where } B[t] = \begin{bmatrix} B_1(q_y[t], p[t]) \\ \vdots \\ B_n(q_y[t], p[t]) \end{bmatrix};$$

and
deriving the digital predistortion parameters, $x_k$, according to:

$$\bar{x} = \left(\left(\frac{\rho}{n}\right)I + G\right)^{-1} L.$$

13. The method of claim 11, wherein adaptively adjusting the digital predistortion parameters, $x_k$, comprises:
approximating the digital predistortion parameters, $x_k$, according to a stochastic gradient process.

14. The method of any of claim 1, wherein acquiring the data samples representing operation of the RF transmission path to transmit radio signals in the different subbands comprises:
selecting the data samples from a plurality of data samples according to a variety criterion computed based on the variety measure for the each data record, wherein the plurality of records are arranged in a variety database structure in which each record corresponds to one of the data samples.

15. A linearization system to perform digital predistortion of signals provided to a radio frequency (RF) transmission path configured to transmit radio signals in a plurality of subbands within a spectral range, the system comprising:
the RF transmission path comprising at least one power amplifier that produces output with non-linear distortions; and
a digital predistorter comprising an adaptation section and a compensator, the digital predistorter configured to:
configure the compensator to predistort signals comprising arbitrary spectral content within the spectral range, including:
acquire data samples representing operation of the RF transmission path to transmit radio signals in different subbands, each data sample including a digital input signal provided to the RF transmission path for transmission and a digital sensed signal representing a sensing of a radio transmission in response to the provided digital signal, the each digital input signal representing spectral content concentrated in a respective single corresponding subband within the spectral range, and
update parameters of the digital predistorter according to the acquired data samples to mitigate non-linear characteristics of the RF transmission path;
receive a further input signal for transmission by the RF transmission path, the further input signal representing spectral content in a particular subband within the spectral range; and
use the configured compensator to process the further input signal to yield a predistorted signal for providing to the RF transmission path.

16. The system of claim 15, wherein the digital predistorter configured to acquire the data samples is configured to:
controllably adjust a wireless device comprising the RF transmission path to operate in one or more of the different subbands within the spectral range; and
at each of the one or more of the different subbands, measure at least one set of samples.

17. The system of claim 15, wherein the digital predistorter configured to acquire the data samples is configured to:
measure during runtime, subsequent to an initial computation of the parameters of the digital predistorter, additional sets of samples at additional subbands within the spectral range; and
re-update the parameters of the digital predistorter further based on at least some of the additional sets of samples.

18. The system of claim 15, wherein the digital predistorter configured to use the compensator is configured to:
derive from a first set of non-linear functions an expanded set of non-linear functions of the digital predistorter, the expanded set of non-linear functions including (d+1) groups of non-linear functions, with d being representative of a number of operating condition parameters, wherein a first group of the expanded set of non-linear functions includes the first set of non-linear functions without any modification, and wherein each of the remaining d groups of the expanded set of non-linear functions is determined as a transformation of the first set of non-linear functions according to a function of at least one of the operating condition parameters; and
weigh the expanded set of non-linear functions with the updated digital predistortion parameters, to process the further input signal.

19. The system of claim 15, wherein the digital predistorter configured to acquire the data samples representing operation of the RF transmission path to transmit radio signals in the different subbands is configured to:
select the data samples from a plurality of data samples according to a variety criterion computed based on the variety measure for the each data record, wherein the plurality of records are arranged in a variety database structure in which each record corresponds to one of the one or more data samples.

20. A non-transitory machine-readable medium storing a design structure comprising elements that, when processed in a computer-aided design system, generate a machine-executable representation of a linearization system that is used to fabricate hardware comprising:
a radio frequency (RF) transmission path circuit comprising at least one power amplifier that produces output with non-linear distortions; and
a digital predistorter circuit comprising an adaptation section and a compensator, the digital predistorter configured to:
configure the compensator to predistort signals comprising arbitrary spectral content within the spectral range, including:
acquire data samples representing operation of the RF transmission path circuit to transmit radio signals in different subbands, each data sample including a digital input signal provided to the RF transmission path circuit for transmission and a digital sensed signal representing a sensing of a radio transmission in response to the provided digital signal, the each digital input signal representing spectral content concentrated in a respective single corresponding subband within the spectral range, and
update parameters of the digital predistorter according to the acquired data samples to mitigate non-linear characteristics of the RF transmission path circuit;
receive a further input signal for transmission by the RF transmission path circuit, the further input signal representing spectral content in a particular subband within the spectral range; and
use the configured compensator to process the further input signal to yield a predistorted signal for providing to the RF transmission path circuit.

* * * * *